(12) United States Patent
Chen

(10) Patent No.: US 9,345,112 B2
(45) Date of Patent: May 17, 2016

(54) MICROCONTROLLER-BASED MULTIFUNCTIONAL ELECTRONIC SWITCH AND LIGHTING APPARATUS HAVING THE SAME

(71) Applicant: Chia-Teh Chen, Taipei (TW)

(72) Inventor: Chia-Teh Chen, Taipei (TW)

( * ) Notice: Subject to any disclaimer, the term of this patent is extended or adjusted under 35 U.S.C. 154(b) by 0 days.

(21) Appl. No.: 14/579,248

(22) Filed: Dec. 22, 2014

(65) Prior Publication Data

US 2015/0108904 A1 Apr. 23, 2015

Related U.S. Application Data

(63) Continuation-in-part of application No. 13/792,002, filed on Mar. 9, 2013, now Pat. No. 8,947,000.

(51) Int. Cl.
*H05B 37/02* (2006.01)
*H03K 17/13* (2006.01)
*H03K 17/94* (2006.01)
*H05B 39/08* (2006.01)
*H05B 33/08* (2006.01)

(52) U.S. Cl.
CPC .......... *H05B 37/0227* (2013.01); *H03K 17/133* (2013.01); *H03K 17/941* (2013.01); *H05B 33/0863* (2013.01); *H05B 39/08* (2013.01); *Y10T 307/25* (2015.04); *Y10T 307/766* (2015.04); *Y10T 307/773* (2015.04); *Y10T 307/826* (2015.04)

(58) Field of Classification Search
USPC .................. 315/159, 360, 362; 340/541, 567
See application file for complete search history.

(56) References Cited

U.S. PATENT DOCUMENTS

| | | | | | |
|---|---|---|---|---|---|
| 5,946,209 | A | * | 8/1999 | Eckel | H01H 47/007 315/159 |
| 8,310,163 | B2 | * | 11/2012 | Chen | H05B 33/0809 315/159 |
| 2013/0257315 | A1 | * | 10/2013 | Restrepo | H05B 37/0209 315/362 |

\* cited by examiner

*Primary Examiner* — Thuy Vinh Tran
(74) *Attorney, Agent, or Firm* — Li & Cai Intellectual Property (USA) Office

(57) ABSTRACT

A microcontroller-based multifunctional electronic switch uses a detection circuit design to convert external motion signals into message carrying sensing signals readable to the microcontroller. Based on the time length of sensing signals and the format of the sensing signals received in a preset instant period of time the microcontroller through the operation of its software program codes written in the OTPROM is able to recognize the working modes chosen by the external signal generating user and thereby selecting the appropriate loops of subroutine for execution. The system and method of the present invention may simultaneously be applicable to detection circuit design using infrared ray sensor, electro-static induction sensor, conduction based touch sensor or push button sensor for performing multifunction such as controlling the on/off switch, the illumination power and the color temperature within the capacity of a single lighting device or an electrical appliance.

49 Claims, 19 Drawing Sheets

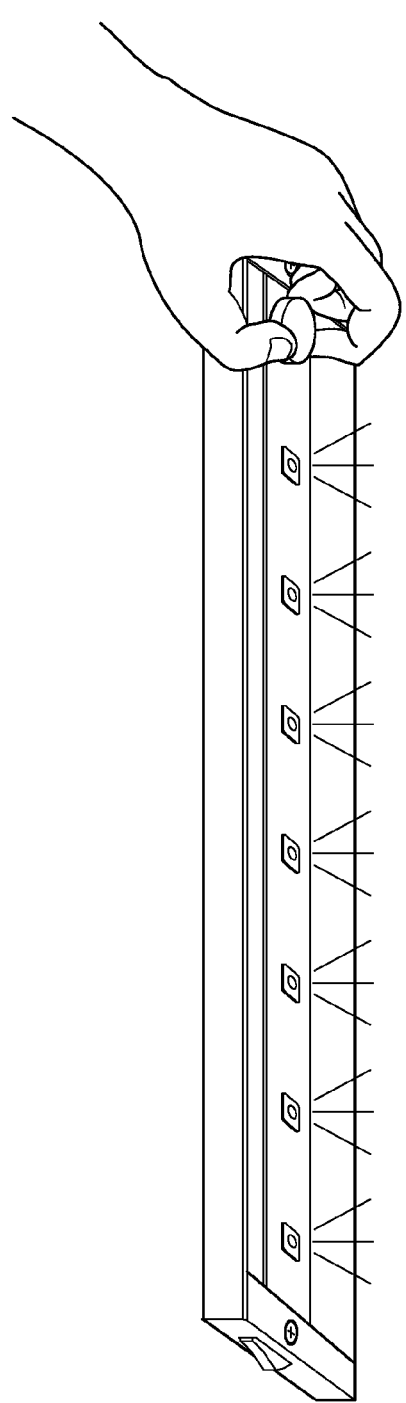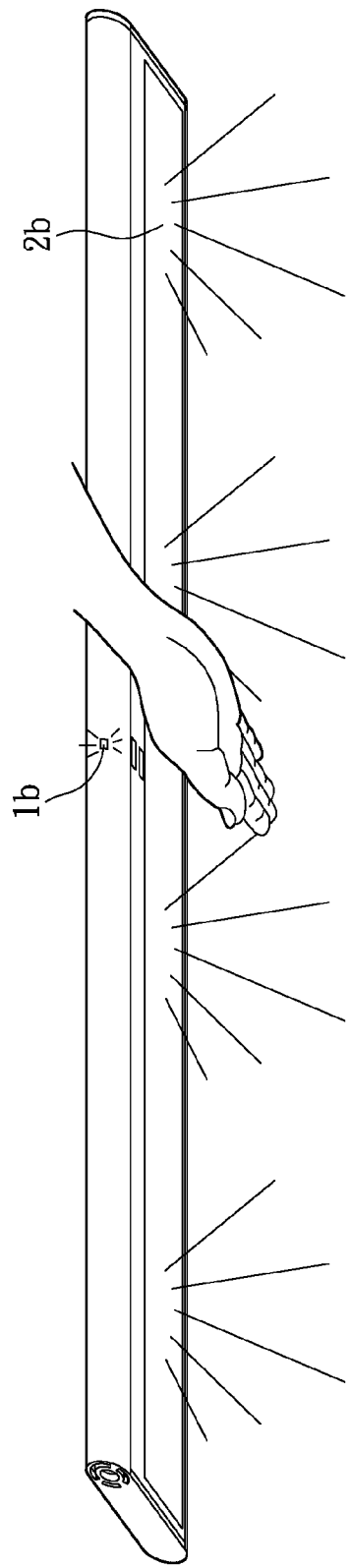
FIG. 10A (PRIOR ART)
FIG. 10B

MICROCONTROLLER-BASED MULTIFUNCTIONAL ELECTRONIC SWITCH AND LIGHTING APPARATUS HAVING THE SAME

CROSS-REFERENCE TO RELATED APPLICATIONS

This application is a continuation-in-part of Non-provisional application Ser. No. 13/792,002 filed on Mar. 9, 2013, currently pending, the entire contents of which are incorporated herein by reference.

BACKGROUND

1. Technical Field

The present disclosure relates to a technology using a microcontroller with program codes designed to provide a user friendly solution for performing on/off switch control, diming control, and timer management for a lighting apparatus or an electrical appliance.

2. Description of Related Art

A mechanical-type electric switch is a manually operated electromechanical device. Its function is based on attaching or detaching two metal conductors to produce a short or open circuit, respectively. This mechanical-type switch is not suitable for installing in a space where has the concern of gas explosion, because an instantaneous surge current, produced by suddenly engaging or releasing the metallic contact of the switch, may generate electric sparks to ignite fire.

A controllable semiconductor switching element, such as a triac, has nearly zero voltage between two output-electrodes in conduction mode and nearly zero current through two output-electrodes in cut-off mode. Solid state electronic switch utilizing the above unique features of triac for circuit on/off switch control can avoid generating electric arc, since the main current pathway of the solid-state switch is not formed by engaging the two metal conductors. It becomes a much better choice than mechanical-type electric switch from the stand point of safety consideration.

Solid-state electronic switches are constructed with various methods to trigger controllable switching element, like triac or thyristor, into conduction or cutoff for desired electric power transmission. For example, U.S. Pat. No. 4,322,637 disclosed a technique using optical coupling element to control bi-directional thyristor or triac in conduction or off state; or another U.S. Pat. No. 6,285,140B1 disclosed a technique using microcontroller incorporated with zero-crossing-point detector to generate AC-synchronized time-delay pulse to control triac in on or cut-off state so as to transmit variable electric power to a light-emitting diode load.

Mostly a mechanical toggle or spring button of similar setup is usually applied on the electronic switch to facilitate manual on/off switch operation. The operation of electronic switch with mechanical toggle means an inevitable contact by hand which is not appropriate in working places such as kitchens or hospitals. To relieve concerns of contagion or contamination resulted through hand contacts, touchless switches are developed. For example, U.S. Pat. No. 5,637,863 disclosed a technique utilized infrared sensor to activate electronic switch to operate on/off switch control, and even dimming control presumably by modifying its circuit design.

In retrospect, the above mentioned prior arts have however still some drawbacks. For instance, U.S. Pat. No. 5,637,863 used a complicated infrared sensor construction and circuit design; or U.S. Pat. No. 6,285,140B1 did not resort to an efficient control of electric power transmission from power source to various electric impedances which is required in lighting apparatus.

SUMMARY

An exemplary embodiment of the present disclosure provides a microcontroller based electronic switch for detecting an external motion signal. The microcontroller based electronic switch comprises a first controllable switching element, a second controllable switching element, a detection means and a microcontroller. The first controllable switching element is electrically connected between a power source and a first lighting load for emitting light with a first color temperature. The second controllable switching element is electrically connected between the power source and a second lighting load for emitting light with a second color temperature. The detection means is for detecting an external motion signal played by a user and converting said external motion signal into a message carrying sensing signal. The microcontroller with program codes is written and designed to read and interpret the message carrying sensing signal generated by said detection means, wherein said microcontroller is electrically connected between said first controllable switching element and said detection means, said microcontroller is electrically connected between said second controllable switching element and said detection means. Said microcontroller controls a conduction state or cutoff state of said first controllable switching element and said second controllable switching element according to said message carrying sensing signal generated by said detection means. When the first controllable switching element and the second controllable switching element are in the conduction state, said microcontroller further controls electric power transmission levels from the power source to the first lighting load and the second lighting load according to specific format of said message carrying sensing signal received from said detection means.

In one exemplary embodiment, the detection means is an infrared ray sensor comprising a means for emitting infrared light to form a defined infrared ray detecting zone and a means for detecting infrared light reflected from an object moving into said infrared ray detecting zone. A circuitry responsively generates a message carrying sensing signal having a first voltage with a time length corresponding to the time interval the object entering and staying in said infrared ray detecting zone. When the object leaves the infrared ray detecting zone, the infrared ray sensor delivers a second voltage signal.

In one exemplary embodiment, the detection means is an electrostatic induction sensor comprising a copper sheet sensing unit with adequately designed shape and size to form an electrostatic detecting zone. A circuitry responsively generates a message carrying sensing signal having a first voltage with a time length corresponding to the time interval an inductive object enters and stays in said electrostatic detecting zone. When said object leaves said electrostatic detecting zone, said electrostatic sensor delivers a second voltage signal.

In one exemplary embodiment, the detection means is a direct touch interface (such as a push button or a touch sensor) connecting with a pin of the microcontroller. When the user contacts the direct touch interface (for example, presses the push button) for a time interval, a first voltage signal is detected by the microcontroller which is a message carrying sensing signal having the first voltage with a time length corresponding to the time interval the touch interface being contacted. When the user leaves the direct touch interface (for example, releases the button), the direct touch interface delivers a second voltage signal.

An exemplary embodiment of the present disclosure provides a lighting apparatus comprising a first lighting load, a second lighting load, a diffuser and a microcontroller based electronic switch. The first lighting load is for emitting light with a first color temperature. The second lighting load is for emitting light with a second color temperature. The diffuser covers the first lighting load and the second lighting load. The microcontroller based electronic switch comprises a first controllable switching element, a second controllable switching element, a detection means and a microcontroller. The first controllable switching element is electrically connected between the first lighting load and a power source. The second controllable switching element is electrically connected between the second lighting load and the power source. The detection means is for detecting an external motion signal played by a user and converting said external motion signal into a message carrying sensing signal. The microcontroller with program codes is written and designed to read and interpret the message carrying sensing signal generated by said detection means, wherein said microcontroller is electrically connected between said first controllable switching element and said detection means, said microcontroller is electrically connected between said second controllable switching element and said detection means. Said microcontroller controls a conduction state or cutoff state of said first controllable switching element and said second controllable switching element according to said message carrying sensing signal generated by said detection means. When the first controllable switching element and second controllable switching element are in the conduction state, said microcontroller further controls electric power transmission levels from the power source to the first lighting load and the second lighting load according to specific format of said message carrying sensing signal received from said detection means. With the microcontroller based electronic switch to control the lighting power levels, the color temperature of the diffused light (also called the blended or mingled light) of the first lighting load and the second lighting load can be controlled.

In one exemplary embodiment, the detection means is an infrared ray sensor comprising a means for emitting infrared light to form a defined infrared ray detecting zone and a means for detecting infrared light reflected from an object moving into said infrared ray detecting zone. A circuitry responsively generates a message carrying sensing signal having a first voltage with a time length corresponding to the time interval the object entering and staying in said infrared ray detecting zone. When the object leaves the infrared ray detecting zone, the infrared ray sensor delivers a second voltage signal.

In one exemplary embodiment, the detection means is an electrostatic induction sensor comprising a copper sheet sensing unit with adequately designed shape and size to form an electrostatic detecting zone. A circuitry responsively generates a message carrying sensing signal having a first voltage with a time length corresponding to the time interval an inductive object enters and stays in said electrostatic detecting zone. When said object leaves said electrostatic detecting zone, said electrostatic sensor delivers a second voltage signal.

In one exemplary embodiment, the detection means is a direct touch interface (such as a push button or a touch sensor) connecting with a pin of the microcontroller. When the user contacts the direct touch interface (for example, presses the push button) for a time interval, a first voltage signal is detected by the microcontroller which is a message carrying sensing signal having the first voltage with a time length corresponding to the time interval the touch interface being contacted. When the user leaves the direct touch interface (for example, releases the button), the direct touch interface delivers a second voltage signal.

To sum up, the present disclosure is characteristic in, a contactless interface between the user and the multifunctional electronic switch is created to implement at least two operation modes of the electronic switch by using software codes written in OTPROM (one-time programmable read only memory) of microcontroller to analyze the message carrying sensing signals.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 10A is an application diagram of a traditional popular piece of under cabinet light with LED as light source.

FIG. 10B is an application diagram of an exemplary embodiment of the present disclosure for a LED under cabinet light featured with a touchless interface between the user and the under cabinet light.

DESCRIPTION OF THE EXEMPLARY EMBODIMENTS

Figure 1:
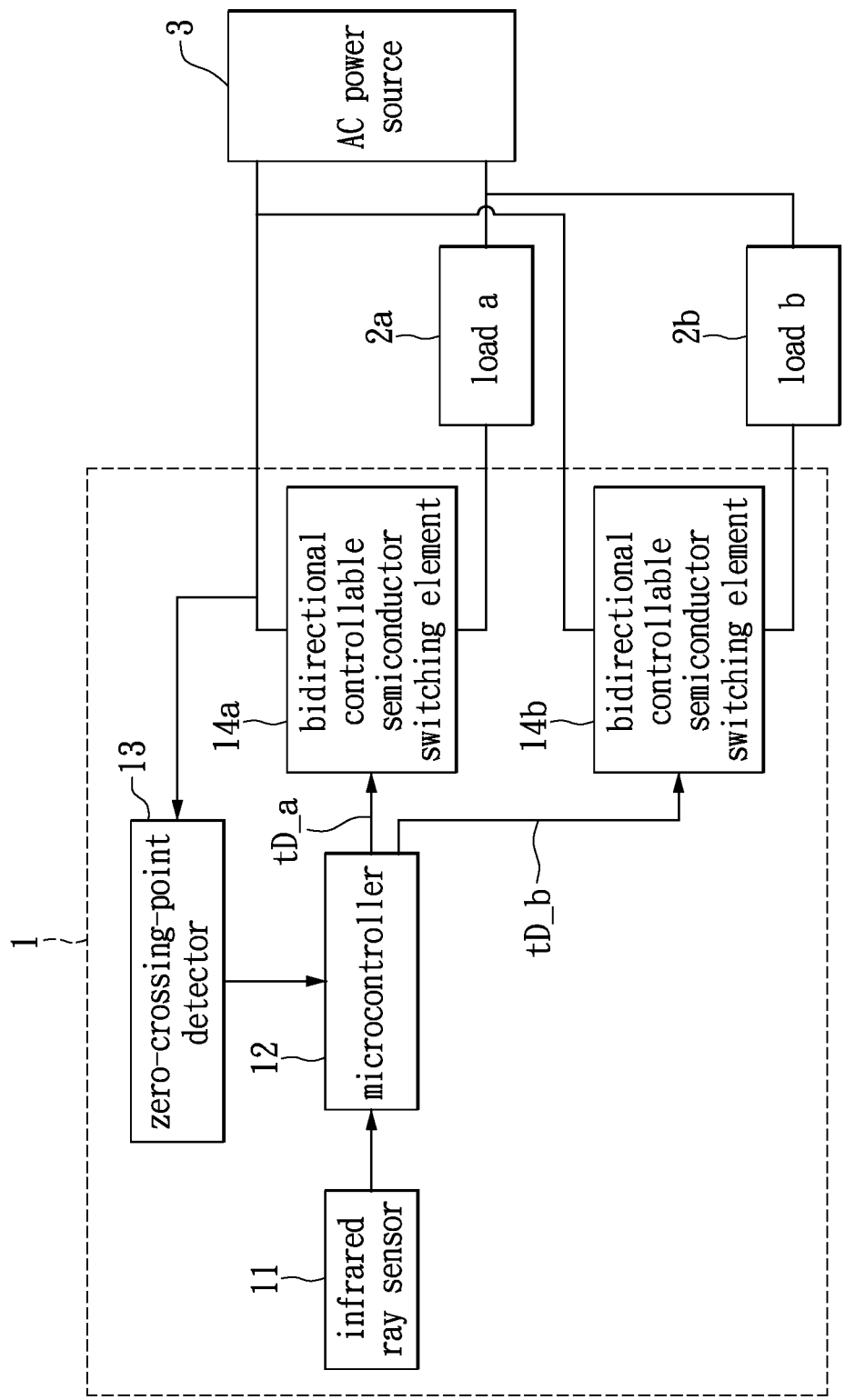
FIG. 1 is a block diagram of a microcontroller based electronic switch using an infrared ray sensor as a detection means applied for two AC lighting loads with different color temperatures powered by an AC power source according to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Referring to FIG. 1, FIG. 1 is a block diagram of a microcontroller based electronic switch using an infrared ray sensor as a detection means applied for two AC lighting loads with different color temperatures powered by an AC power source according to an exemplary embodiment of the present disclosure. A microcontroller based electronic switch 1 is connected in series to an AC power source 3, and is further connected to a first lighting load 2a (also indicated by "load a" shown in FIG. 1) and a second lighting load 2b (also indicated by "load b" shown in FIG. 1), so as to control AC power delivered to the first lighting load 2a and the second lighting load 2b. The microcontroller based electronic switch 1 comprises at least an infrared ray sensor 11, a microcontroller 12, a zero-crossing-point detector 13, and two bi-directional controllable semiconductor switching elements 14a, 14b. The bi-directional controllable semiconductor switching element 14a is a first controllable switching element. The bi-directional controllable semiconductor switching element 14b is a second controllable switching element. The infrared ray sensor 11 is connected to one pin of microcontroller 12 to transmit a low voltage sensing signal to the microcontroller 12, wherein the low voltage sensing signal represents a message carrying sensing signal of the infrared ray sensor 11. The zero-crossing-point detector 13 is connected to another pin of microcontroller 12 and is also electrically coupled to the AC power source 3 to produce AC power synchronized signals which are fed to the microcontroller 12. The microcontroller 12 through its one designated pin is electrically connected to the control electrode of the bi-directional controllable semiconductor switching element 14a so as using appropriate conduction phase (characterized by tD_a) to control the electrical conduction state of the bi-directional controllable semiconductor switching element 14a. Also, the microcontroller 12 through its another one designated pin is electrically connected to the control electrode of the bi-directional controllable semiconductor switching element 14b so as using appropriate conduction phase (characterized by tD_b) to control the electrical conduction state of the bi-directional controllable semiconductor switching element 14b.

The first lighting load 2a is for emitting light with low color temperature (first color temperature), and the second lighting load 2b is for emitting light with high color temperature (second color temperature). When the bi-directional controllable semiconductor switching elements 14a, 14b are in the conduction state, said microcontroller 12 further controls electric power transmission levels from the AC power source 3 to the first lighting load 2a and the second lighting load 2b according to the signal format of the message carrying sensing signal received from the infrared ray sensor 11. In this embodiment, the electric power transmission level for the first lighting load 2a can range from X-watt to Y-watt, and the electric power transmission level for the second lighting load 2b can range from Y-watt to X-watt, wherein X+Y is a constant value, but the present disclosure is not so restricted. An apparent color temperature generated by blending the lights emitted from the two lighting loads 2a,2b may be controlled by the power levels X and Y according to $$CT_{app} = CT_{2a} \cdot X/(X+Y) + CT_{2b} \cdot Y/(X+Y),$$

where $CT_{app}$ is said apparent color temperature, $CT_{2a}$ and $CT_{2b}$ are respectively the color temperatures of the first and the second lighting load 2a, 2b.

For example, X-watt can be three watts and Y-watt can be nine watts, such that the power of the first lighting load 2a ranges from three watts to nine watts, and the power of the second lighting load 2b ranges from nine watts to three watts, wherein the total power of the first lighting load 2a and the second lighting load 2b can be fixed to twelve watts. When the color temperatures of the first lighting load 2a and the second lighting load 2b are respectively 3000K ($CT_{2a}$) and 5700K ($CT_{2b}$), the apparent color temperature ($CT_{app}$) of the blended or diffused light of the first lighting load 2a and the second lighting load 2b can range nearly from 3700K (nine watts of the first lighting load 2a and three watts of the second lighting load 2b) to 5000K (three watts of the first lighting load 2a and nine watts of the second lighting load 2b) depending on the electric power transmission levels fed to the first lighting load 2a and the second lighting load 2b controlled by the microcontroller 12.

In another example, X-watt can be zero watts and Y-watt can be twelve watts, such that the power of the first lighting load 2a ranges from zero watts to twelve watts, and the power of the second lighting load 2b ranges from twelve watts to zero watts, wherein X+Y watt can be fixed to twelve watts. When the color temperatures of the first lighting load 2a and the second lighting load 2b are respectively 3000K and 5700K, the apparent color temperature of the diffused light of the first lighting load 2a and the second lighting load 2b can range from 3000K (twelve watts of the first lighting load 2*a* and no power of the second lighting load 2*b*) to 5700K (twelve watts of the second lighting load 2*b* and no power of the first lighting load 2*a*) depending on the electric power transmission levels fed to the first lighting load 2*a* and the second lighting load 2*b*. Thus, a desired color temperature may be generated by controlling the power levels of the first lighting load 2*a* and the second lighting load 2*b* to create proper color blending effect under a fixed total lighting power level with this type of microcontroller based electronic switch.

In still another embodiment, the electric power transmission level for the first lighting load 2*a* can range from X-watt to Y-watt, and the electric power transmission level for the second lighting load 2*b* can range from Z-watt to W-watt, wherein X, Y, Z and W can be referred to different power levels. However, the present disclosure does not restrict the variation ranges of the power levels of the two loads 2*a*, 2*b*.

The infrared ray sensor 11 detects object motions coming from the user and converts the detected result into message carrying low voltage sensing signals readable to the microcontroller 12. The microcontroller 12 decodes the low voltage sensing signals (message carrying low voltage sensing signals) according to the program designed and written in its OTPROM (one-time programmable read only memory) memory. The microcontroller 12 is with program codes written and designed to read and interpret the message carrying sensing signal generated by the infrared ray sensor 11. The infrared ray sensor 11 is an exemplary embodiment for a detection means to detect the external motion signal played by the user and convert the external motion signal into a message carrying sensing signal. The microcontroller 12 recognizes the working mode that the user has chosen and proceeds to execute the corresponding loop of subroutine for performing the selected working mode. In view of implementing versatile controls of color temperature and illumination level of a lighting apparatus, at least two working modes are provided and defined in the software codes with corresponding loops of subroutine for execution.

One working mode is on/off switch control mode. In this working mode, according to the low voltage sensing signal from the infrared ray sensor 11, the microcontroller 12 operates the bi-directional controllable semiconductor switching element 14 in conduction state or cut-off state alternatively. More specifically, in this working mode, together with the zero-crossing-point detector 13, the microcontroller 12 generates phase delay voltage pulses synchronized with the AC power source 3 in each AC-half cycle to trigger the bi-directional controllable semiconductor switching elements 14*a*, 14*b* to be in proper conduction states to respectively transmit X-watt and Y-watt electric power to the first lighting load 2*a* and the second lighting load 2*b*, such that a fixed amount of total electric power (X+Y watts) is sent to the two lighting loads 2*a*, 2*b*; or the microcontroller 12 generates a zero voltage to set the bi-directional controllable semiconductor switching elements 14*a*, 14*b* to be in cut-off state, and thereby ceases to transmit the fixed electric power to the two lighting loads 2*a*, 2*b*.

Another working mode is switching between low color temperature and high color temperature. When the first switching element is in a full conduction state and the second switching element is in a full cutoff state, the light consequently demonstrates the low color temperature of illumination characteristic. When the first switching element is in the full cutoff state and the second switching element is in the full conduction state, the lighting apparatus consequently demonstrates the high color temperature of illumination characteristic.

Still another working mode is color temperature tuning mode about controlling different levels of electric power transmission to the two lighting loads 2*a*, 2*b* by controlling the conduction rate of the bi-directional controllable semiconductor switching elements 14*a* and 14*b*. Using the synchronized signals produced by the zero-crossing-point detector 13 as a reference, the microcontroller 12 generates phase delay voltage pulses synchronized with the AC power source 3 in each AC half-cycle to trigger the conduction of the bi-directional controllable semiconductor switching elements 14 to respectively transmit X-watt and Y-watt electric power to the first lighting load 2*a* and the second lighting load 2*b*. Responding to the low voltage sensing signals of specific format from the infrared ray sensor 11, the microcontroller 12 execute the corresponding loop of subroutine for performing the color temperature tuning mode, such that the phase delays of the triggering pulses are continuously changed during each half cycle period of the AC power source 3, to render the conduction rate of the bi-directional controllable semiconductor switching elements 14*a* gradually increasing and, at the same time, the conduction rate of the bi-directional controllable semiconductor switching elements 14*b* gradually decreasing, or vice versa. Consequently, the power level X of the lighting loads 2*a* is gradually increasing and the power level Y of the lighting loads 2*b* is gradually decreasing, or vice versa. The color temperature of the blended or diffused light of the two lighting load 2*a*, 2*b* may thus be adjusted in the color temperature tuning mode through controlling the conduction rate of the switching elements 14*a*, 14*b* to change the power levels of the two lighting loads 2*a*, 2*b*. At the end of the color temperature tuning mode, a desired apparent color temperature diffused from the two lighting loads 2*a*, 2*b* can be set and managed by the message carrying sensing signal from the infrared ray sensor 11 which is generated according to the user's intention.

For the color temperature tuning mode, additional sub-modes can be performed in detail. When the detection means generates the first voltage sensing signal, said microcontroller manages to output the control signal to the first controllable switching element and the second controllable switching element to alternately perform one of programmed combinations of conduction states between the first controllable switching element and the second controllable switching element, wherein the combinations include at least three combination modes; wherein the first combination mode is where the first controllable switching element is in a complete conduction state while the second controllable switching element is in a cutoff state with the lighting apparatus performing the low color temperature, wherein the second combination mode is where the first controllable switching element is in a cutoff state while the second controllable switching element is in a complete conduction state with the lighting apparatus performing the high color temperature, wherein the third combination mode is where both the first controllable switching element and the second controllable switching element are in cutoff state with the lighting apparatus being turned off.

Figure 2:
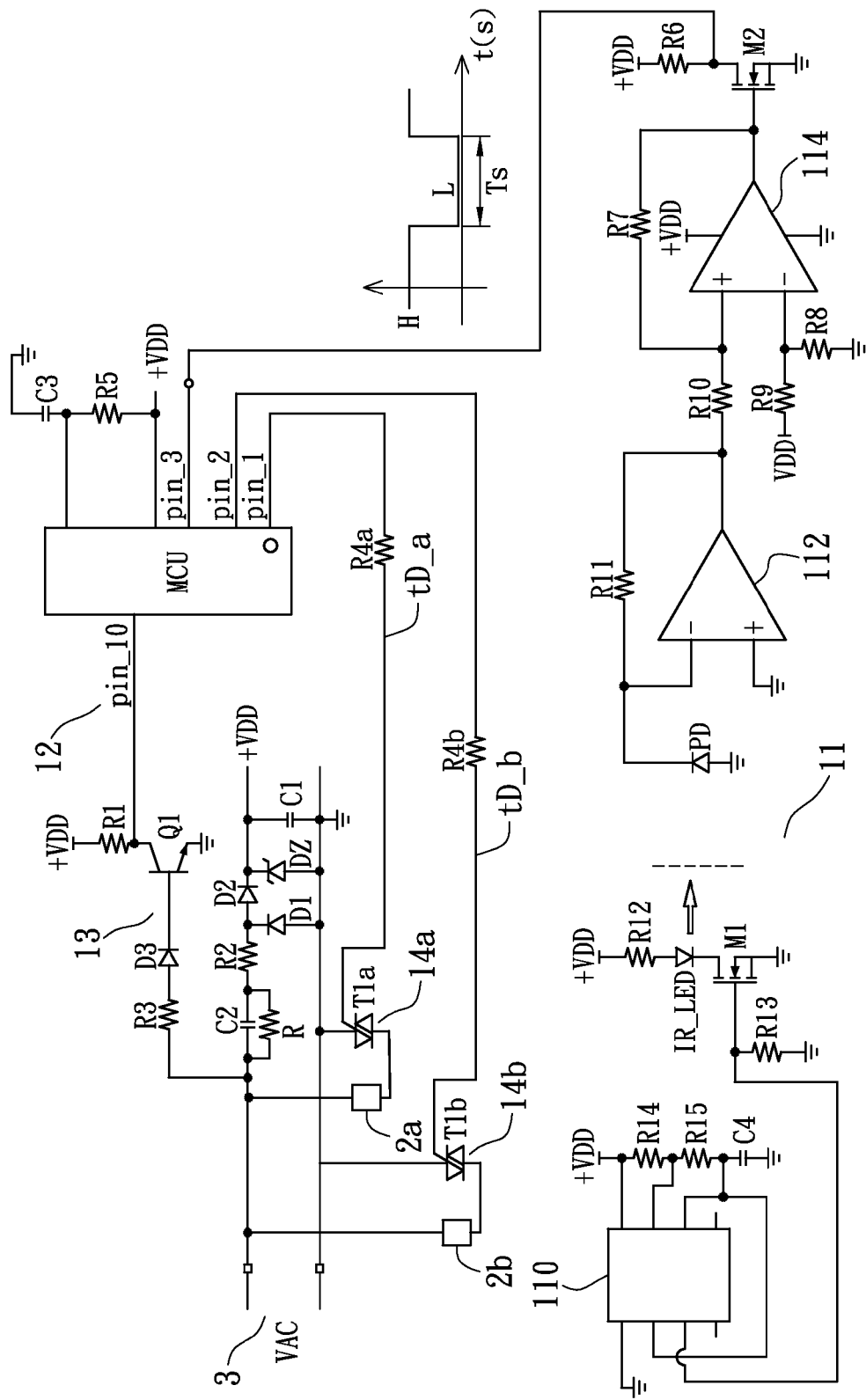
FIG. 2 is a circuit diagram of a microcontroller based electronic switch using an infrared ray sensor applied for two AC lighting loads with different color temperatures powered by an AC power source according to an exemplary embodiment of the present disclosure.

Referring to FIG. 1 and FIG. 2, FIG. 2 is a circuit diagram of a microcontroller based electronic switch applied for an AC power source according to an exemplary embodiment of the present disclosure.

As FIG. 2 shows, the microcontroller based electronic switch 1 comprises an infrared ray sensor 11, a microcontroller 12, a zero-crossing-point detector 13, and two bi-directional controllable semiconductor switching elements 14*a*, 14b. The microcontroller based electronic switch 1 is connected respectively through the bi-directional controllable semiconductor switching elements 14a, 14b with the first lighting load 2a and the second lighting load 2b, both have different color temperatures, and then connected to the AC power source 3 in a serial fashion. A DC voltage VDD for the circuit system is derived by conventional voltage reduction and rectification from the AC power 3. The infrared ray sensor 11 is composed of a transmitting circuit 110 and a receiving circuit 112, wherein the message carrying sensing signal is sent out by a transistor stage M2. The drain of the transistor M2 is connected to a pin pin_3 of the microcontroller 12 to deliver the message carrying sensing signals to the microcontroller 12.

The zero-crossing-point detector 13 is composed of a transistor Q1 and a diode D3. The collector of the transistor Q1 is connected to a pin pin_10 of the microcontroller 12, the base of the transistor Q1 is connected to a conducting wire of the AC power source 3 through the diode D3 and a resistor R3. In the positive half-cycle for AC power source 3, the transistor Q1 is saturated conducting, and the voltage at the collector of the transistor Q1 is close to zero. In the negative half-cycle for AC power source 3, the transistor Q1 is cut-off, and the voltage at the collector of the transistor Q1 is a high voltage of VDD. Corresponding to the sine wave of the AC power source 3, the zero-crossing-point detector 13 generates therefore signals of square wave alternatively with a low voltage and a high voltage through the collector of the transistor Q1. The square wave is synchronized with the AC power source 3 and sent to a pin pin_10 of the microcontroller 12 for the purpose of controlling conduction phase, and the details thereof are described later. In practice, the bi-directional controllable semiconductor switching element 14a can be a triac T1a, the pin pin_1 of the microcontroller 12 is connected to the gate of the triac T1a to control the conduction or cut-off state of the triac T1a, or to control the conduction rate of the triac T1a. Also, the bi-directional controllable semiconductor switching element 14b can be a triac T1b, the pin pin_2 of the microcontroller 12 is connected to the gate of the triac T1b to control the conduction or cut-off state of the triac T1b, or to control the conduction rate of the triac T1b. Thus, the first lighting load 2a and the second lighting load 2b are respectively driven by triac T1a and triac T1b with phase delay pulses characterized by time delays tD_a and tD_b with respect to the zero crossing point of AC power voltage in each AC half-cycle to respectively display X-watt (or Y-watt) lighting from the first lighting load 2a and Y-watt (or X-watt) power lighting from the second lighting load 2b controlled by infrared ray sensor 11. Thus, the color temperature of the diffused light of the two lighting load 2a, 2b may be adjusted by properly selecting tD_a and tD_b, such that the summation of tD_a and tD_b is a constant, and the total lighting power of the first lighting load 2a (X) and the second lighting load 2b (Y), X+Y, is a fixed value.

Still referring to FIG. 2, the infrared ray sensor 11 comprises a transmitting circuit and a receiving circuit. In the transmitting circuit, an infrared light-emitting diode IR_LED is connected to the drain of the transistor M1 in a serial fashion, and the gate of the transistor M1 is connected to an output of the timer 110. In practice, the timer 110 can be a 555 timer IC. The 555 timer IC generates a square-wave with a frequency of about 3 kHz to modulate the drain current of the transistor M1, such that the infrared light-emitting diode IR_LED provides an infrared light signal with a square wave form which is severed as the light source of the infrared ray sensor.

The receiving circuit is an infrared light detection circuit and comprises a photosensitive diode PD, two serially connected amplifiers 112, 114, and a transistor M2. The drain of the transistor M2 is connected to a pin pin_3 of the microcontroller 12. In practice, the amplifiers 112 and 114 can be LM324 operational amplifier. The combination of the amplifier 114 and resistors R7 through R10 is a Schmitt trigger circuit having a threshold voltage, and the threshold voltage is produced by the voltage divider composed by resistors R8 and R9. The Schmitt trigger circuit makes possible a high discrimination of a true detection to a false one.

The photosensitive diode PD is used to receive the infrared light signal from the transmitting circuit. If the output voltage of the amplifier 112 exceeds the threshold voltage, the amplifier 114 produces a high voltage applied to the gate of the transistor M2, such that the transistor M2 is turned on. Therefore, the drain of the transistor M2 provides a low voltage sensing signal which is close to zero voltage, and the time length of the low voltage sensing signal is related to the time period the infrared ray is detected.

In addition, if the photosensitive diode PD does not receive the infrared light signal, the output voltage of the amplifier 112 is lower than the threshold voltage, and then the amplifier 114 provides a low voltage to the gate of the transistor M2, such that the transistor M2 is turned off. Therefore, the drain of the transistor M2 provides a high voltage of VDD. In other words, the pin pin_3 of the microcontroller 12 receives either a low voltage sensing signal or a high voltage depending on whether the infrared ray sensor 11 detects the infrared light or not, wherein the time length of the low voltage sensing signal is about the time period within which the infrared light is detected.

In other words, the infrared ray sensor 11 generates a sensing signal which is characterized by a low voltage within a time length. The sensing signal with a specific time length of low voltage can be considered as a sensing signal format which carries message to make the microcontroller 12 to operate in one of at least two working modes accordingly, wherein one working mode is on/off switch control mode and the another one is color temperature tuning mode to control the conduction rate of the bi-directional controllable semiconductor switching elements 14a and 14b. Further, still another mode is dimming control mode. The color temperature tuning mode can give a color temperature tuning cycle to change the color temperature of the blended light, wherein the total power of the blended light is unchanged (X+Y watts is unchanged during the cycle). The dimming control mode provides dimming cycles to set the total power of the blended light (X+Y watts is changed during the cycle), wherein the color temperature of the blended light is unchanged during the dimming cycle.

Figure 3A:
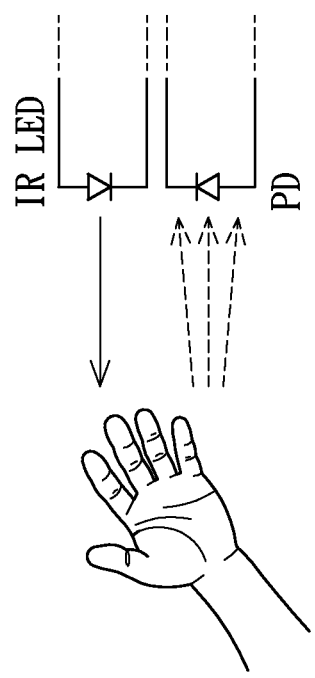
FIG. 3A is a schematic diagram showing a practical operation of an infrared ray sensor associated with a microcontroller based electronic switch according to an exemplary embodiment of the present disclosure.
Figure 3B:
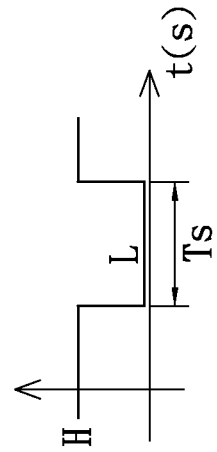
FIG. 3B is a waveform diagram showing a low voltage sensing signal according to an exemplary embodiment of the present disclosure.

Referring to FIG. 2, FIG. 3A and FIG. 3B, FIG. 3A is a schematic diagram showing a practical operation of an infrared ray sensor associated with a microcontroller based electronic switch according to an exemplary embodiment of the present disclosure, and FIG. 3B is a waveform diagram showing a low voltage sensing signal according to an exemplary embodiment of the present disclosure. In FIG. 3A, the infrared light-emitting diode IR_LED is parallel arranged to the photosensitive diode PD without accurate alignment. When an object, here is a human hand, moves in front of the infrared light-emitting diode IR_LED, the infrared light emitted from the infrared light-emitting diode IR_LED scatters from the object surface onto the photo sensing surface of the photosensitive diode PD.

FIG. 3B shows a waveform of the low voltage sensing signal provided from the infrared ray sensor 11. If the photosensitive diode PD does not receive the infrared light scattered from the target object surface, or the intensity of the infrared light received by the photosensitive diode PD is insufficient, the drain of the transistor M2 provides a high voltage H of VDD. Within an appropriate distance, the photosensitive diode PD receives the infrared light scattered from the object surface, and the intensity of the received infrared light is enough to cause the output voltage of the amplifier 112 exceeding the threshold voltage, the amplifier 114 produces a high voltage, such that the transistor M2 is turned on, and the drain of the transistor M2 provides a signal with a low voltage L of about zero volt. In other words, when the infrared ray sensor 11 detects an object, most commonly user's hand, purposefully entering the infrared ray detecting zone, the infrared ray sensor 11 generates a low voltage sensing signal, by contrast when an object is not within the infrared ray detecting zone, the infrared ray sensor 11 generates a high voltage. In brief, the infrared ray sensor 11 comprises a means for emitting infrared light to form the defined infrared ray detecting zone, and a means for detecting infrared light reflected from the object moving into the infrared ray detecting zone.

The appropriate distance or the infrared ray detecting zone is defined as an effective sensing range or area of the infrared ray sensor 11. In FIG. 3B, the time length Ts of the low voltage L is approximately equal to the time period that an object stays within the infrared ray detecting zone, wherein the time period is about a few tenths through a few seconds. When the object leaves the infrared ray detecting zone, the signal delivered from the infrared ray sensor 11 changes from a low voltage L to a high voltage H, as shown in FIG. 3B. Hence the sensing signal generated from the infrared ray sensor 11 is a binary signal readable to the program written in the OTPROM memory of the microcontroller 12. The microcontroller based electronic switch 1 utilizes specific sensing signal format characterized by the time length Ts of the low voltage sensing signal to implement at least two functions, namely, on/off switch control and dimming control. By introducing a preset time To, the microcontroller 12 can execute subroutine corresponding to the functions of the on/off switch control, the color temperature tuning control and the illumination power dimming control determined by a comparison scheme of the time length Ts with the preset time To. The user can therefore operates the microcontroller-based electronic switch 1 in a convenient manner simply by moving his hand into or out of the infrared ray detecting zone of the infrared ray sensor 11, and staying his hand there for a time period to select desired performance function.

Figure 4:
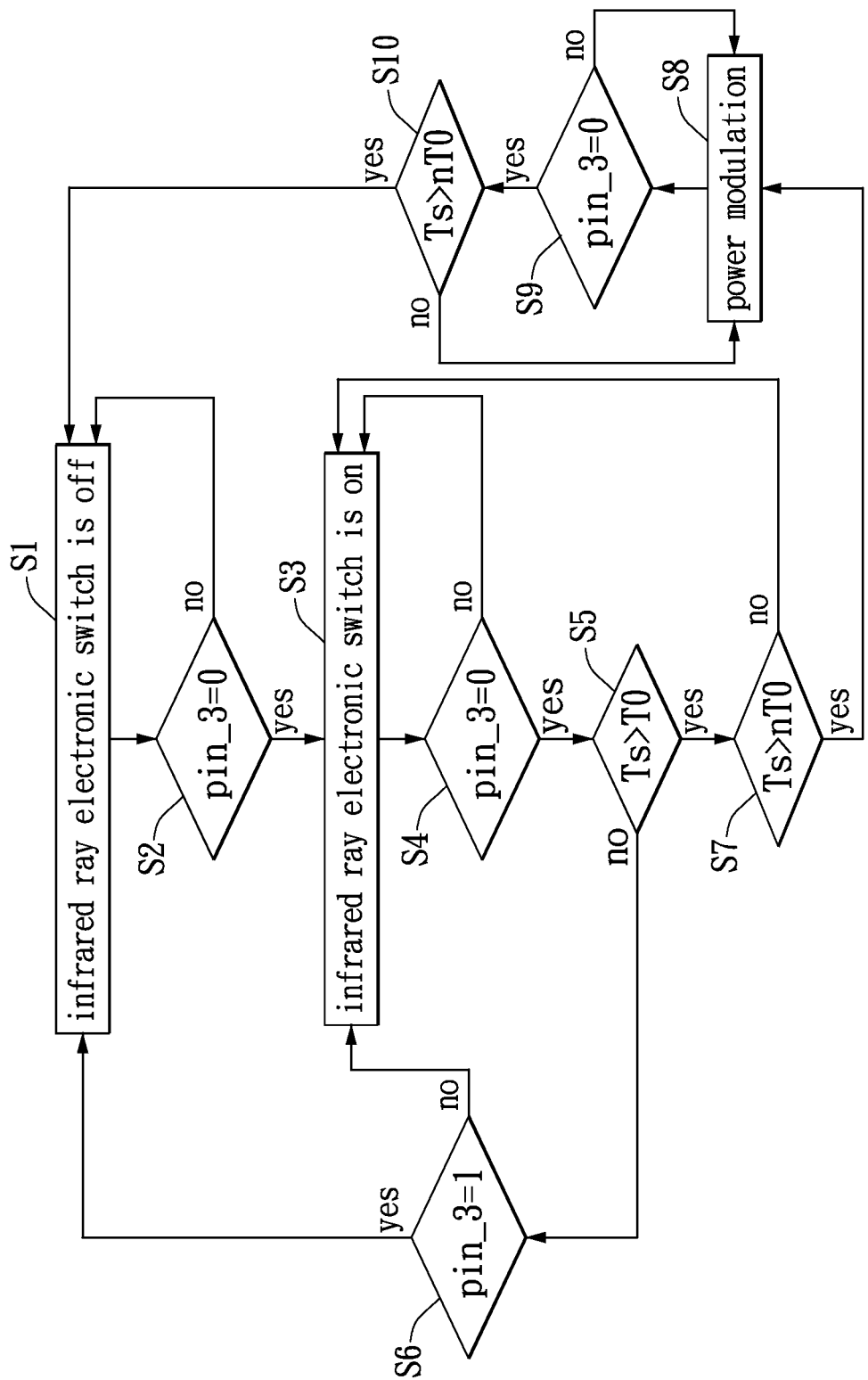
FIG. 4 is a flow chart of a program executed in a microcontroller based electronic switch according to an exemplary embodiment of the present disclosure.

Referring to FIG. 2, FIG. 3 and FIG. 4, FIG. 4 is a flow chart of a program executed in a microcontroller of a microcontroller based electronic switch according to an exemplary embodiment of the present disclosure. The program written in the OTPROM memory of the microcontroller 12 includes several subroutine loops. These loops are started from the loop of steps S1 through S6 of the on/off switch control mode, and may jump into the loop of steps S8 through S10 of the color temperature tuning mode (or the dimming control mode) according to the time length Ts of the low voltage sensing signal. The pin pin_3 of the microcontroller 12 receives a high voltage H or a low voltage L from the infrared ray sensor 11, wherein the time length Ts of the low voltage sensing signal is about the time length which the user's hand stays within the infrared ray detecting zone.

The program of the microcontroller 12 starts its execution from the loop of steps S1 and S2 in which the microcontroller based electronic switch 1 is off. The program of the microcontroller 12 scans the voltage at the pin pin_3 of the microcontroller 12. If the voltage at the pin pin_3 of the microcontroller 12 is high (bit 1), the program of the microcontroller 12 stays in the loop of steps S1 and S2 that the microcontroller based electronic switch 1 is off. On the contrary, if the voltage at the pin pin_3 is low (bit 0), the program of the microcontroller 12 jumps into the loop of steps S3 through S6 in which the microcontroller based electronic switch 1 is on. At step S4 when the microcontroller based electronic switch 1 is on, the program of the microcontroller 12 scans the voltage at the pin pin_3 of the microcontroller 12. If the voltage at the pin pin_3 of the microcontroller 12 is low (bit 0), the program of the microcontroller 12 jumps to step S5 to compare the time length Ts with a preset time To. In practice, the preset time To is between 1 through 3 seconds, but the present disclosure is not limited thereto.

At step S5, the program of the microcontroller 12 check the time length Ts, if Ts is shorter than the preset time To, step S5 proceeds to step S6 to detect whether the voltage at the pin pin_3 is momentary a high voltage H (bit 1). At step S6, if the voltage at the pin pin_3 is the voltage H, the program goes back to the loop of steps S1 and S2 in which the microcontroller based electronic switch 1 is off. At step S6, if the voltage at the pin pin_3 is low, the program remains in the loop of steps S3 through S6 in which the microcontroller based electronic switch 1 is on.

To sum up, the on/off switch control mode is described by the loops consisting of steps S1 through S6 that the microcontroller based electronic switch 1 is operated in off- and on-state rotationally. The microcontroller based electronic switch 1 is on or off according to whether the user moves his hand into and then pulls out the infrared ray detecting zone of the infrared ray sensor 11 within the preset time To.

At step S5, the program of the microcontroller 12 check the time length Ts, if the time length Ts is longer than the preset time To, the program jumps to step S7 to detect whether the time length Ts is longer than n times the preset time To (n≥2). At step S7, if the time length Ts is not longer than n times the preset time To, the program goes back to the loop of steps S3 through S6 that the microcontroller based electronic switch 1 remains on. At step S7, if the time length Ts is longer than n times the preset time To, the program jumps into a loop consisting of steps S8 through S10 to execute a subroutine for the color temperature tuning mode (or the dimming control mode) of microcontroller based electronic switch 1. FIG. 4 does not show the details of subroutine associated with the color temperature tuning mode (or the dimming control mode), but the process is described in short as follows. At step 9, the program of the microcontroller 12 scans the voltage at the pin pin_3 of the microcontroller 12. The program proceeds to step 10 from Step 9, if the voltage at the pin pin_3 is low. At step 10, the subroutine of the microcontroller 12 checks if Ts>nTo. If the voltage at the pin pin_3 is low for several times, and the time lengths denoted by Ts or Ts' are shorter than n times the preset time To, the subroutine remains in the rotation loop defined by step 8 through S10, and microcontroller 12 continuously increases or decreases the electric power transmission to the lighting loads 2a, 2b by controlling the conduction rates. If the electric power of the lighting load reaches the maximum or minimum electric power, the program of the microcontroller 12 responds no more to the low voltage sensing signal. At step 10, if the time length Ts is longer than n times the preset time To, the program of the microcontroller 12 jumps back to the loop of steps S1 and S2 in which the microcontroller based electronic switch 1 is off. Then, the program of the microcontroller 12 resumes itself from steps S1 and S2 in a rotational manner to execute the subroutines represented by the steps shown in FIG. 4.

In the exemplary embodiment of FIG. 2, the preset time To and the number n can be set 2 seconds and 2, respectively. Referring to the steps executed by the microcontroller 12 in FIG. 4, if the detected time length Ts of the low voltage sensing signal at the pin pin_3 is less than 2 seconds, that means the time period which the hand stays within the infrared ray detecting zone is less than 2 seconds, the microcontroller 12 remains in the current function mode. If the detected time length Ts at the pin pin_3 is longer than 4 seconds, that means the time length which the hand stays within the infrared ray detecting zone is longer than 4 seconds, the microcontroller 12 changes the current function mode to another one function mode. In other words, if the time length Ts of the low voltage sensing signal is shorter than the preset time To, the microcontroller 12 operates either in on/off switch mode or in color temperature tuning mode (or dimming control mode). If the detected time length Ts of the low voltage sensing signal is longer than n times the preset time To, the microcontroller 12 changes its program execution from the on/off switch mode into the color temperature tuning mode (or the dimming control mode) and vice versa.

In another embodiment, the concept of the present disclosure can be further extended to implement a multifunctional electronic switch having at least three functions built in one, which are on/off switch control, illumination dimming control and color temperature management. The program written in the OTPROM memory of the microcontroller can be modified in such a manner that the microcontroller responds not only to the low voltage sensing signal of the infrared ray sensor, but also to a specific sequence of the sensing signals. The microcontroller executes subroutines of working modes corresponding to the said three functions according to the detected time length Ts and special sequence of the low voltage sensing signals. The first working mode is on/off switch control mode used to control the conduction or cut-off state of the controllable semiconductor switching elements. The second working mode is dimming control mode used to control the conduction rates of the controllable semiconductor switching elements. The third working mode is color temperature management mode used to change alternatively from a high color temperature to a low one, or vice versa, or to tune the color temperature of the diffused light from two lighting loads. When the infrared ray sensor generates a low voltage sensing signal within the preset time To, the microcontroller operates in the on/off switch mode by controlling the conduction or cut-off state of both the controllable semiconductor switching elements alternately. If the time length Ts of the low voltage sensing signal is longer than n times the preset time To, the microcontroller changes its operation from the on/off switch control mode to the color temperature tuning or dimming control mode. Once in the dimming (tuning) control mode, the microcontroller executes subroutine to gradually change the conduction rates of the controllable semiconductor switching elements from the maximum conduction rate to the minimum conduction rate, and then to gradually change the conduction rate from the minimum conduction rate to the maximum conduction rate for completing a dimming cycle wherein the process is a free run. In the dimming cycle with free run, the moment when the infrared ray sensor provides a high voltage is a dimming end point. According to the dimming control mode design, the microcontroller locks the conduction rates of the controllable semiconductor switching elements at the dimming end point. Thereafter, if the infrared ray sensor generates a plurality of low voltage sensing signals, for instance, a plural signal of two consecutive sensing signals, each within the preset time To, the microcontroller operates in the color temperature management mode by executing a subroutine to select a color temperature of the diffused light from two lighting loads through controlling different power levels delivered to the two lighting loads of different color temperatures. It is clear to see the advantage of the present disclosure to integrate various switch control functions in one without changing the hardware circuit design. All are simply done by defining the format of sensing signals and by modifying the program written in the OTPROM memory in the microcontroller.

As mentioned above, various switch control functions can be integrated in one without changing the hardware circuit design of the microcontroller and the two loads. There may be variations of detection means in using electronic switch of the present disclosure for touch and touch less applications. For example, (1) Dual detection means technology in which two detection means are integrated in one electronic switch, for instance, by connecting two infrared ray sensors respectively with two pins of the microcontroller 12 in FIG. 1, to control a lighting apparatus: one first detection means sending message carrying sensing signal to control the color temperature of illumination characteristic, one second detection means sending message carrying sensing signal to control the light intensity of illumination characteristic; (2) Single detection means technology in which one detection means is built in an electronic switch to generate message carrying sensing signal to control a lighting apparatus by using different types of signal formats: a first type sensing signal (for instance, a low voltage within a short preset time To) to control the on/off performance, a second type sensing signal (for instance, a low voltage with a long time length Ts) to control the switching between low color temperature mode and high color temperature mode, and a third type sensing signal (for instance, a plural signals of two consecutive low voltages) for dimming the light intensity of illumination characteristic; (3) Single detection means technology using free running technique in response to a specific format sensing signal to offer selection of color temperature.

The free running subroutine can be designed to apply to an electronic switch installed on wall for managing the illumination characteristics of a remotely located lighting apparatus such as a ceiling light installed on the ceiling. Unless a wireless communication unit is employed, a typical wall switch is constrained by a single circuit to only perform one illumination characteristic, being either controlling the light intensity or controlling the color temperature. If both the color temperature and light intensity are required to manage, the only way is to use the free running technology to execute one of the two illumination characteristics. The free running subroutine can be so deigned such that whenever a power supply is on, the microcontroller with software subroutine will check the memory unit to see if a preset color temperature or light intensity is established to decide if the free running subroutine needs to be activated, in the absence of preset datum, a free running action will be activated to gradually change the lighting intensity from maximum intensity to minimum intensity and continuously from minimum intensity to maximum intensity for completing a tuning/dimming cycle on an automatic basis and at any moment during a tuning/dimming cycle the user can determine the light intensity by acting a motion signal to lock in the level of the light intensity. The automatic tuning/dimming only continues for a short duration and in the absence of selection by the user, the microcontroller with program codes will execute a predetermined lighting intensity. Similarly, the same mechanism can be applied for tuning the color temperature to allow the user to select the desired color temperature during a free tuning cycle by acting a motion signal with the detection means to lock in the desired level of color temperature. With the help of free running technology, the wall control unit can therefore be used solely for operating the remaining illumination characteristic.

The concept of free running technology can be further applied to develop a life style LED lighting solution where the color temperature is gradually changed according to time schedule programmed for performing different color temperature catering to the living style of human beings that people are more used to low color temperature with a warm atmosphere during the night time from 7 PM through 5 PM while during the day time people are more used to the high color temperature for working hours. A clock can be employed to provide the time information necessary for working with a program of scheduled color temperature pattern. The conduction rate r1 of the first controllable switching element can be varied in a reverse direction with respect to the conduction rate r2 of the second controllable switching element, the microcontroller with program codes executes to vary the conduction rate of the first controllable switching element according to a programmed pattern of color temperature changes in a subroutine; when r1 is equal to zero, the first controllable switching element is in a cutoff state while the second controllable switching element is in a full conduction state, the lighting apparatus performs a low color temperature, 3000K for instance, which may be the desired color temperature for the night time from 7 PM to 5 PM, when r1 is maximum, the first controllable switching element is in a full conduction state while the second controllable switching element is in a cut off state, the lighting apparatus performs a high color temperature, 5000K for instance, which may be the desired color temperature for noon time at 12 PM. A single color temperature may be assigned for night period from 7 PM through 5 AM for the sleeping time. For day time it can be programmed to gradually change the values of r1 and r2 from maximum to 0 between 5 AM to 12 PM and from 0 to maximum between 12 PM to 7 PM. With such arrangement at any time when the power is turned on the lighting apparatus automatically performs a desired color temperature according to the programmed pattern of color temperature at scheduled time frame.

Figure 5:
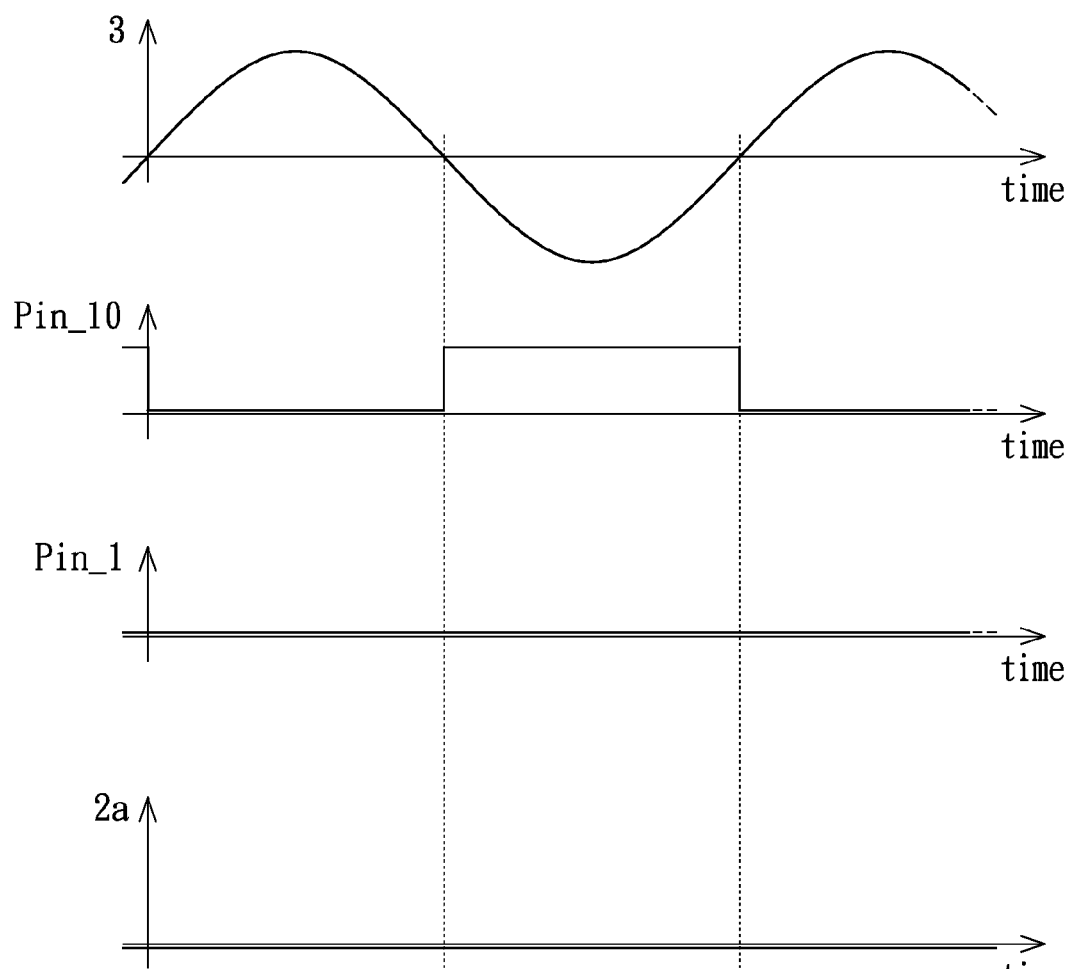
FIG. 5 is a voltage waveform diagram of a microcontroller based electronic switch when the electronic switch operating in the on/off switch control mode is in cut-off state according to an exemplary embodiment of the present disclosure.
Figure 6:
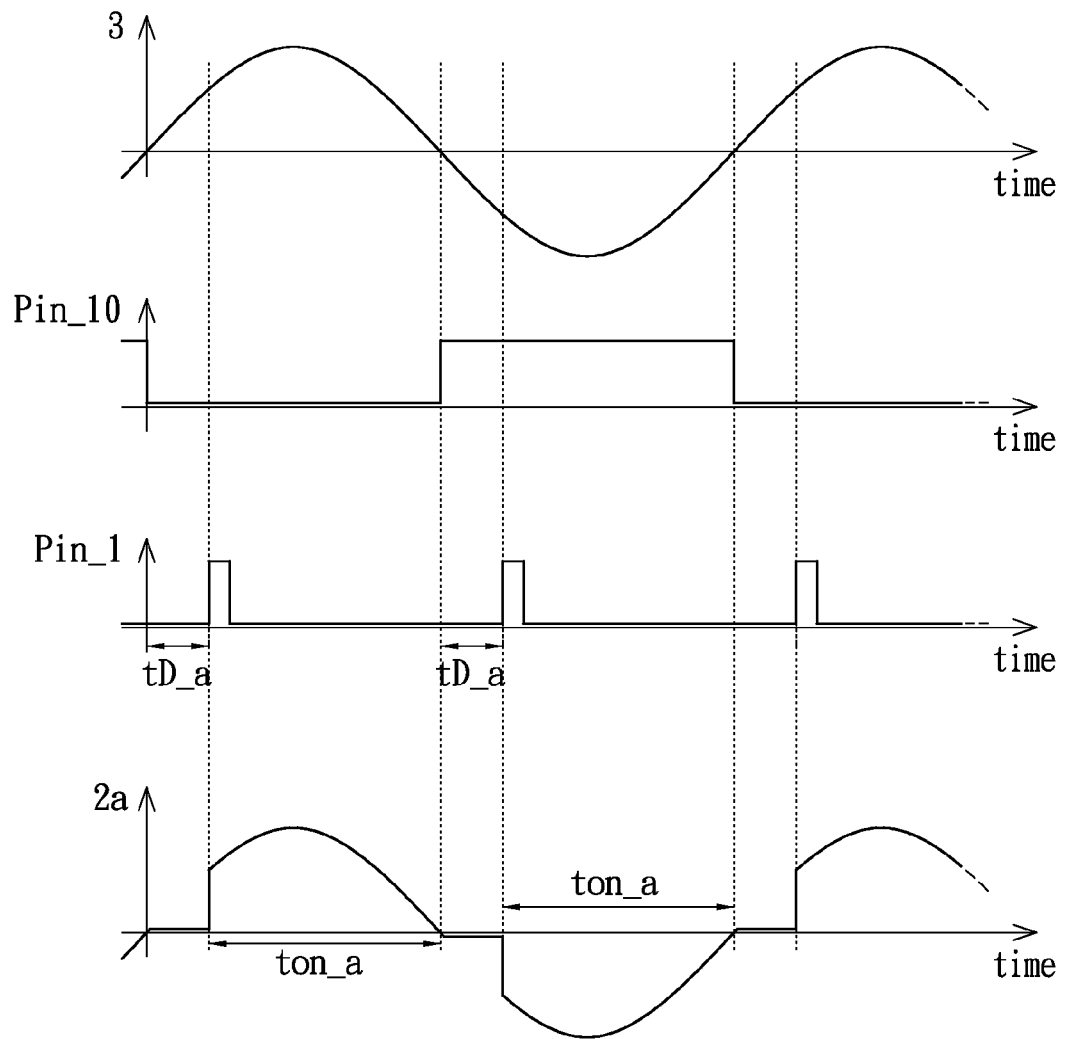
FIG. 6 is a voltage waveform diagram of a microcontroller based electronic switch when the electronic switch operating in the on/off switch control mode is in conduction state according to an exemplary embodiment of the present disclosure.
Figure 7:
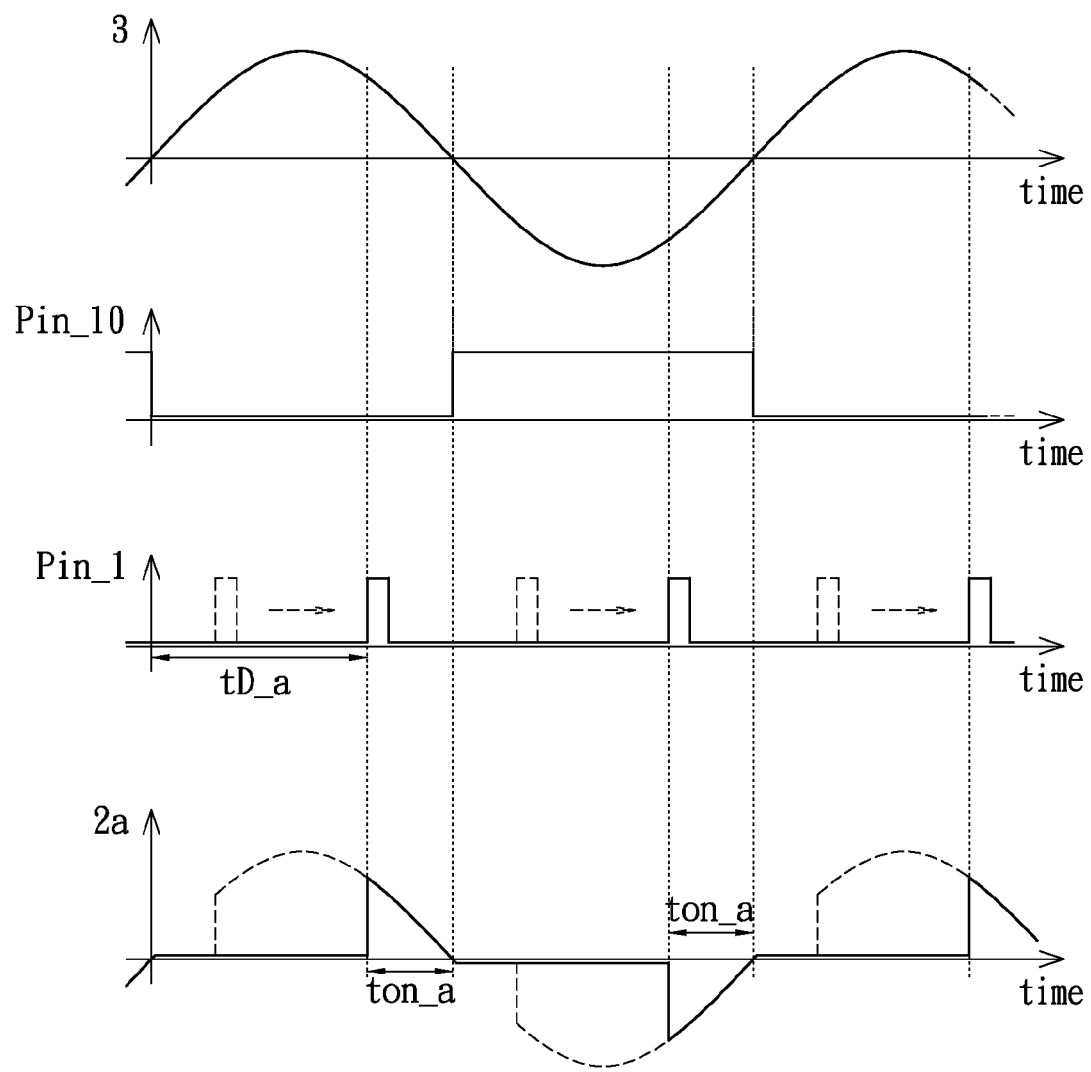
FIG. 7 is a voltage waveform diagram of a microcontroller based electronic switch operating in the dimming control mode according to an exemplary embodiment of the present disclosure.

Refer to FIG. 5, FIG. 6 and FIG. 7 in accompanying FIG. 2 and FIG. 4. According to an exemplary embodiment of the present disclosure, FIG. 5 is a voltage waveform diagram of a microcontroller based electronic switch in cut-off state when operating in on/off switch control mode, FIG. 6 is a voltage waveform diagram of a microcontroller based electronic switch in conduction state when operating in on/off switch control mode, and FIG. 7 is a voltage waveform diagram of a microcontroller based electronic switch when operating in dimming control mode. In FIG. 5, FIG. 6, and FIG. 7, the voltage waveforms as shown from the top are, respectively, a sine wave output from the AC power source 3, an output signal of the zero-crossing-point detector 13 that is fed to pin pin_10 of the microcontroller 12, an output signal from the pin pin_1 of the microcontroller 12, and a voltage waveform between the two ends of the load 2a. The voltage waveforms are used to describe the interactions related to the program of the microcontroller 12 and the microcontroller based electronic switch 1 in the above mentioned two working modes. As already described above, the voltage signal generated by the zero-crossing-point detector 13 is a square wave with a low and a high voltage, which is fed to the pin pin_10 of the microcontroller 12 and, to be explained later, served as an external interrupt trigger signal. The voltage signal from the pin pin_1 of the microcontroller 12 is sent to the gate of the triac T1a to control the conduction state of the triac T1a. In the same way, the similar voltage signal from the pin pin_2 of the microcontroller 12 is sent to the gate of the triac T1b to control the conduction state of the triac T1b.

In the program loops corresponding to the on/off switch control mode and the dimming control mode, the microcontroller 12 utilizes the external interrupt control technique to generate voltage pulses synchronized with AC power. To accomplish it, the program of the microcontroller 12 has a setup with the voltage level variations at the pin pin_10 as external interrupt trigger signals. Since the time point of high or low voltage level variation in the signal generated by the zero-crossing-point detector 13 is the zero crossing point of AC sine wave, the external interrupt process is automatically triggered at the zero crossing point of the AC power source 3, and the related meaning of the details are further described in FIG. 6 and FIG. 7.

Referring to FIG. 5 in accompanying FIG. 2 and FIG. 4, the program of the microcontroller 12 starts from the loop of steps S1 and S2 of on/off switch control mode, wherein the microcontroller based electronic switch 1 is off. The program of the microcontroller 12 scans the voltage at the pin pin_3. If the voltage at the pin pin_3 is a high voltage, the microcontroller 12 generates a zero voltage at the pin pin_1, which is fed to the gate of the triac T1a to turn it off. For no current flowing through the triac T1a, the voltage between the two ends of the load 2a is zero in each AC cycle. In the same way, if the voltage at the pin pin_3 is a high voltage, the microcontroller 12 generates a zero voltage at the pin pin_2, which is fed to the gate of the triac T1b to turn it off.

Refer to FIG. 6 in accompanying FIG. 2 and FIG. 4. If the program of the microcontroller 12 detects a low voltage at the pin pin_3, the program of microcontroller 12 jumps to steps S3 and S4 of on/off switch control mode, wherein the microcontroller based electronic switch 1 is on. The microcontroller 12 scans within a few microseconds the voltage at the pin pin_10. The external interrupt happens in each AC half cycle (of some milliseconds) at the time point of voltage level variation in the square wave signal. In the external interrupt process, no other program is executed, instead the program is commanded to go back to the main program instantly. The program of the microcontroller 12 is designed based on the time point when the external interrupt occurs, which is also the zero crossing point of the AC power source 3. After some delay times with respected to the time point of the external interrupt, the program of the microcontroller 12 generates a pulse signal at the pin pin_1 and a pulse signal at the pin pin_2. The signal provided from the pin pin_1 is a zero-crossing-point time-delay pulse having a delay time tD_a after the zero crossing point of AC power. The signal provided from the pin pin_2 is a zero-crossing-point time-delay pulse tD_b having a delay time tD_b after the zero crossing point of AC power. The zero-crossing-point time-delay pulse tD_a (or tD_b) is generated both in the positive and negative half-cycle of the AC power source 3, and used to trigger in synchronization with AC power source 3 the triac T1a (or triac T1b) into conduction, such that the AC power source 3 delivers in each half AC cycle electric power to the first lighting load 2a (or the second lighting load 2b) which is in proportion to a conduction time ton_a of the triac T1a (or ton_b of triac T1b). In contrast with the AC power source 3 and the zero crossing point delay pulses, the voltage waveform on the first lighting load 2a is depicted in FIG. 6, and the conduction time ton_a is designated. The voltage waveform on the second lighting load 2b can be similar to the voltage waveform on the first lighting load 2a, wherein the conduction time ton_b of triac T1b can be different from the conduction time ton_a of the triac T1*a* which are respectively resulted from different delay time tD_b and delay time tD_a of the zero-crossing-point time-delay pulses.

In the loop of steps S3 and S4 of the microcontroller based electronic switch 1 being on, the delay times tD_a and tD_b of the zero-crossing delay voltage pulses are both predetermined values to make a constant average electric power delivered to the loads 2*a*, 2*b*. The color temperature of the diffused light of the two lighting load 2*a*, 2*b* may be controlled by properly selecting tD_a and tD_b, such that the summation of tD_a and tD_b is a constant, and the total lighting power of the first lighting load 2*a* (X) and the second lighting load 2*b* (Y), X+Y, is a fixed value. However, it is not to limit thereto in the present disclosure. By designing a minimum time delay, summation of the conduction time ton_a and ton_b of the triac T1*a* and the triac T1*b* can reach the maximum to make the maximum electric power transmission to the loads 2*a*, 2*b*. In practice, the loads 2*a*, 2*b* can be fluorescent lamps, AC LEDs (light emitting diode) screwed-in LED bulbs or incandescent bulbs, wherein said light-emitting diode module comprises a full-wave rectifier bridge and a plurality of light-emitting diodes in series connected between the two terminals of the rectifier bridge output port. Alternatively, the two loads 2*a*, 2*b* can be DC LED modules power by a DC source.

Refer to FIG. 7 in accompanying FIG. 2 and FIG. 4. In the loop of steps S3 through S6, the microcontroller based electronic switch 1 is on, the program of the microcontroller 12 scans the voltage at the pin pin_3. If the sensing signal fed to the pin pin_3 is a low voltage with the time length Ts longer than nTo (n≥2), the program of the microcontroller 12 jumps to the loop of steps S8 through S10 for executing the color temperature tuning mode. When the microcontroller based electronic switch 1 is in the color temperature tuning mode, the program of the microcontroller 12 scans the voltage at the pin pin_10, so as to generate a zero-crossing-point time-delay pulse with a delay time tD_a at the pin pin_1 and to generate a zero-crossing-point time-delay pulse with a delay time tD_b at the pin pin_2. Simultaneously, the program of the microcontroller 12 scans the voltage at the pin pin_3. If the detected sensing voltage at the pin pin_3 is a low voltage with different time length Ts, the program continuously increases the delay time tD_a and decreases the delay time tD_b, or vice versa, of the zero-crossing-point time-delay pulses generated respectively at the pin pin_1 and pin pin_2, wherein the varying time length tD_a and tD_b are in proportion to the time length Ts. It should be noted that both delay times tD_a and tD_b vary in an appropriate range from "$t_o$" to "$1/(2f)-t_o$", wherein $t_o = (1/2\pi f)\sin^{-1}(V_t/V_m)$, f is the AC frequency, $V_t$ is the threshold voltage or cut-in voltage of the lighting loads 2*a*, 2*b* and $V_m$ is the voltage amplitude of the AC power source 3. This constraint on tD_a and tD_b is required to ensure in each AC half-cycle to stably trigger the triac T1*a* and triac T1*b* into conduction when the threshold voltage $V_m$ of the lighting loads 2*a*, 2*b* are taken into consideration. FIG. 7 shows for one case the waveforms in the color temperature tuning mode wherein the delay time tD_a of the time delay pulse at the pin pin_1 is gradually increased along the time axis. The delay time tD_a decides the time length of the conduction time ton_a of triac T1*a*. The average electric power delivered to the first lighting load 2*a*, which is in proportion to the time length ton_a, is accordingly decreased. At the same time for the same case, not shown in FIG. 7, the delay time tD_b of the time delay pulse at the pin pin_2 is gradually decreased in the reverse direction, the conduction time ton_b of triac T1*b* and the average electric power delivered to the second lighting load 2*b* are thus accordingly increased. Consequently, the color temperature of the diffused light of the two lighting load 2*a*, 2*b* may vary gradually from a high temperature to a low one, or vice versa, due to alternatively changing the power levels of the two lighting load 2*a*, 2*b* controlled by the trigger pulses with delay times tD_a and tD_b. When the voltage at the pin pin_3 becomes high to terminate the color temperature tuning mode, the final values of the delay times tD_a and tD_b are then stored in the memory of the microcontroller 12 as new predetermined values to perform illumination with a desired color temperature and power level.

Figure 8A:
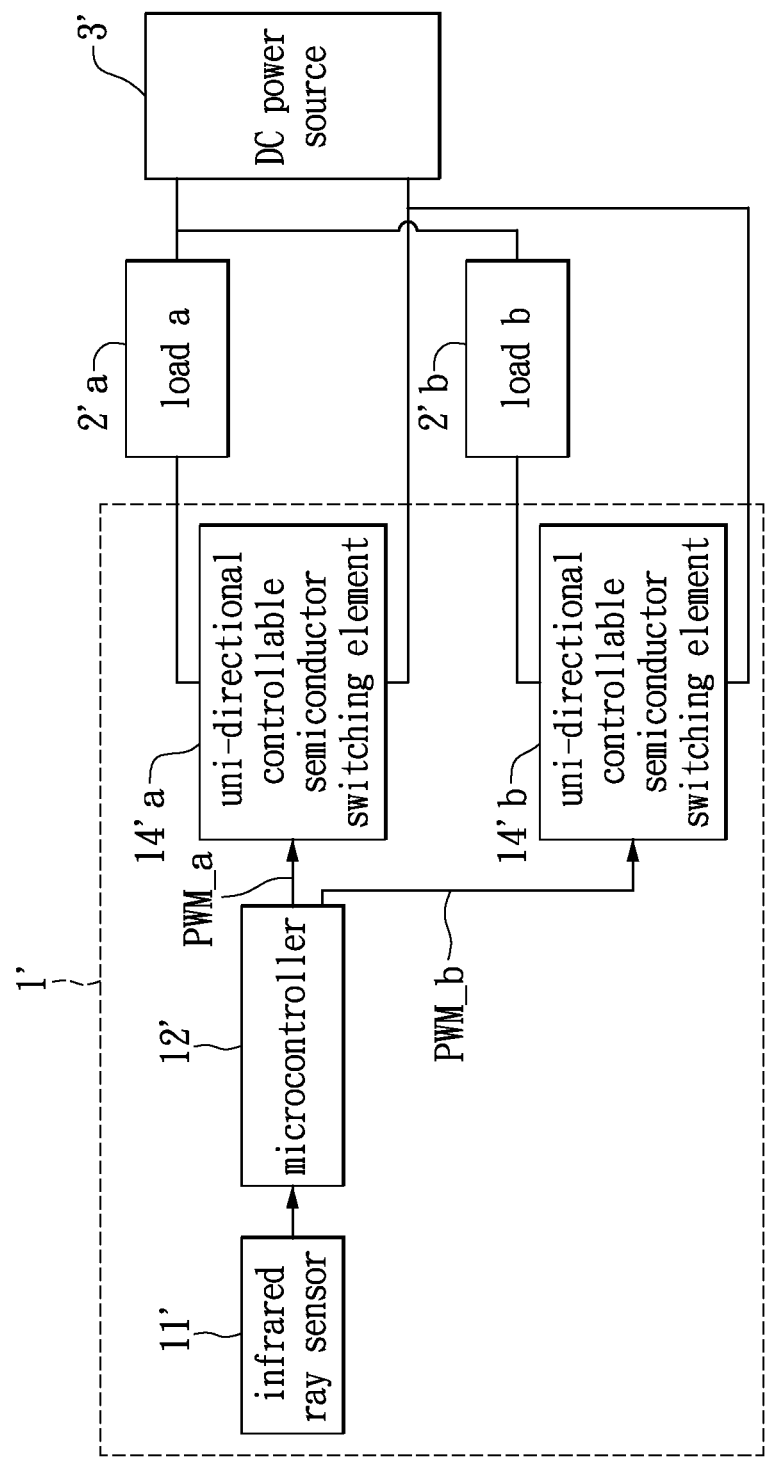
FIG. 8A is a block diagram of a microcontroller based electronic switch for a DC power source according to an exemplary embodiment of the present disclosure.

In addition, the concept of the present disclosure can also be applied to the DC power source, wherein the controllable semiconductor switching element and the program of the microcontroller 12 should be modified slightly, and the zero-crossing-point detector should be removed. Referring to FIG. 8A, FIG. 8A is a block diagram of a microcontroller based electronic switch 1' using an infrared ray sensor as a detection means for a DC power source according to an exemplary embodiment of the present disclosure. The microcontroller based electronic switch 1' is connected to a DC power source 3' and a first lighting load 2'*a* in a serial fashion, so as to control the electric power of the DC power source 3' delivered to the first lighting load 2'*a*. Also, the microcontroller based electronic switch 1' is connected to the DC power source 3' and a second lighting load 2'*b* in a serial fashion, so as to control the electric power of the DC power source 3' delivered to the second lighting load 2'*b*. Compared to FIG. 1, the microcontroller based electronic switch 1' in FIG. 8A comprises an infrared ray sensor 11', a microcontroller 12', and uni-directional controllable semiconductor switching elements 14'*a*, 14'*b*. In practice, the uni-directional controllable semiconductor switching elements 14'*a*, 14'*b* can be bipolar junction transistors (BJTs) or metal-oxide-semiconductor field-effect transistors (MOSFETs). The loads 2'*a* and 2'*b* can respectively emit low color temperature light and high color temperature light. The load 2'*a* and 2'*b* can be light-emitting diodes or incandescent bulbs, but present disclosure is not limited thereto.

Figure 8B:
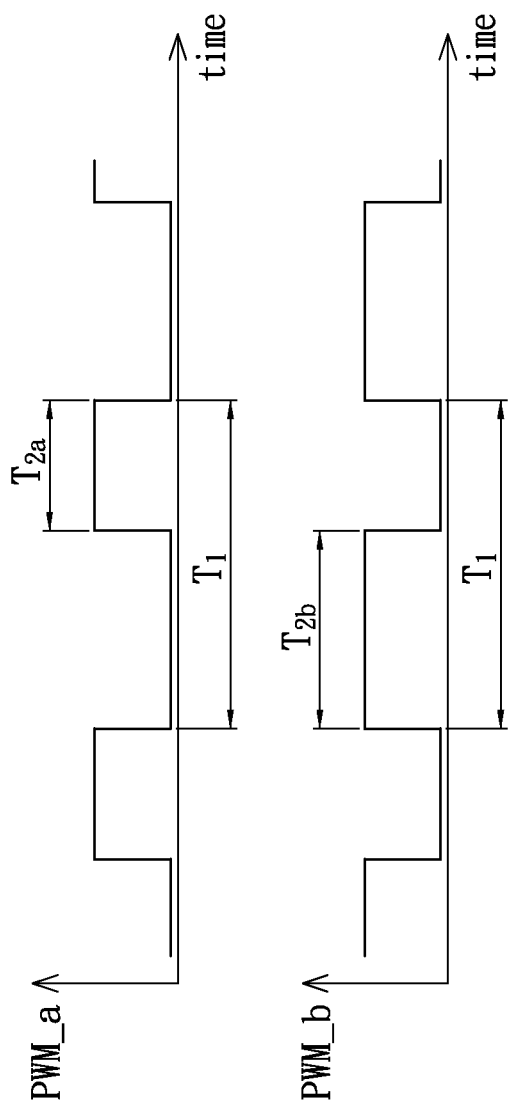
FIG. 8B is a voltage waveform diagram of the pulse width modulation voltage signals associated with FIG. 8A according to an exemplary embodiment of the present disclosure.

Referring to FIG. 3 and FIG. 8B, the infrared ray sensor 11' detects a user's hand, for instance, and converts the outcome into message carrying low voltage sensing signals readable to the microcontroller 12'. The microcontroller 12' decodes the low voltage sensing signal according to the program designed and written in its OTPROM, so as to make the microcontroller based electronic switch 1' operate in on/off switch control mode and color temperature tuning mode (or dimming control mode) accordingly. In the on/off switch control mode when the microcontroller based electronic switch 1' is off, the program of the microcontroller 12' generates a zero voltage fed to the gate of the uni-directional controllable semiconductor switching element 14'*a* (or 14'*b*) so as to turn off the switching element 14'*a* (or 14'*b*). In the on/off switch control mode when the microcontroller based electronic switch 1' is on, the program of the microcontroller 12' generates PWM_a (pulse-width-modulation) (or PWM_b) signal fed to the gate of the uni-directional controllable semiconductor switching element 14'*a* (or 14'*b*) so as to turn on the switching element 14'*a* (or 14'*b*) such that a fixed electric power is transmitted from the DC power source 3' to the load 2'*a* (or 2'*b*).

FIG. 8B is a voltage waveform diagram of the PWM signals according to an exemplary embodiment of the present disclosure. The PWM voltage signal is a square wave signal comprising a zero voltage (or low-voltage) and a high voltage, wherein the high voltage drives the uni-directional controllable semiconductor switching element 14'*a* (or 14'*b*) into conduction.

If the time length of the high voltage is $T_{2a}$ (or $T_{2b}$) and the period of the PWM voltage signal is $T_1$, the average electric power delivered to the load 2′a (or 2′b) through the unidirectional controllable semiconductor switching element 14′a (or 14′b) is proportional to the ratio $T_{2a}/T_1$ (or $T_{2b}/T_1$), which is by definition the duty cycle of the PWM voltage signal and is denoted as $\delta = T_{2a}/T_1$ (or $\delta = T_{2b}/T_1$).

More specifically, the electronic switch 1′ controls on/off and dimming of the first lighting load 2′a and the second lighting load 2′b in response to the operation of the infrared ray sensor 11′. When the switch 1′ is turned on, the microcontroller 12′ sends PWM voltage signals PWM_a and PWM_b for FIG. 8A controlled by the infrared ray sensor 11′: as shown, it is always to generates voltage signals PWM_a and PWM_b with two predetermined time lengths of $T_{2a}$ and $T_{2b}$, wherein $T_{2a}+T_{2b}=T_1$ for respectively controlling the load 2a to generate X watts power illumination and the load 2b to generate Y watts power illumination, where the summation X+Y is a fixed value. It may be $T_{2a} < T_{2b}$ or $T_{2a} > T_{2b}$ in response to the control signal generated by infrared ray sensor 11′. In a free running mode for color temperature tuning in response to the control signal generated by infrared ray sensor 11′, $T_{2a}$ may be varied gradually from a large value to a small one while $T_{2b}$ varied gradually from a small value to a large one, and vice versa, wherein $T_{2a}+T_{2b}=T_1$. A color temperature generated by blending the lights emitted from the lighting load 2′a and 2′b can thus be selected when the free running mode for color temperature tuning is terminated by moving object (for example, the user's hand) out of the detecting zone of the infrared ray sensor 11′, and then the final values of $T_{2a}$ and $T_{2b}$ would be stored in the memory of the microcontroller 11′.

The present disclosure is not limited by the PWM waveforms as depicted in FIG. 8B. In a practical design scheme, the parameters $T_{2a}$ and $T_{2b}$ of the PWM voltage signals can have a relation $T_{2a}+T_{2b}=A$, wherein "A" is a predetermined constant. Since the average electric powers delivered to the lighting loads 2′a and 2′b are respectively proportional to the duty cycles $T_{2a}/T_1$ and $T_{2b}/T_1$, both are smaller than one, the total average lighting power is in proportion to the summation of $T_{2a}/T_1$ and $T_{2b}/T_1$. When the voltage signals PWM_a and PWM_b are designed with A>T1, the color temperature of the diffused light of the two lighting load 2a, 2b can be generated under a total average lighting power larger than the one when A=T1. With A<T1, the total average lighting power is smaller than the one when A=T1. Thus, besides the color temperature tuning, the illumination power level may be controlled through varying the parameter A in a predetermined range by the microcontroller based electronic switch 1′ of the present disclosure.

Figure 9A:
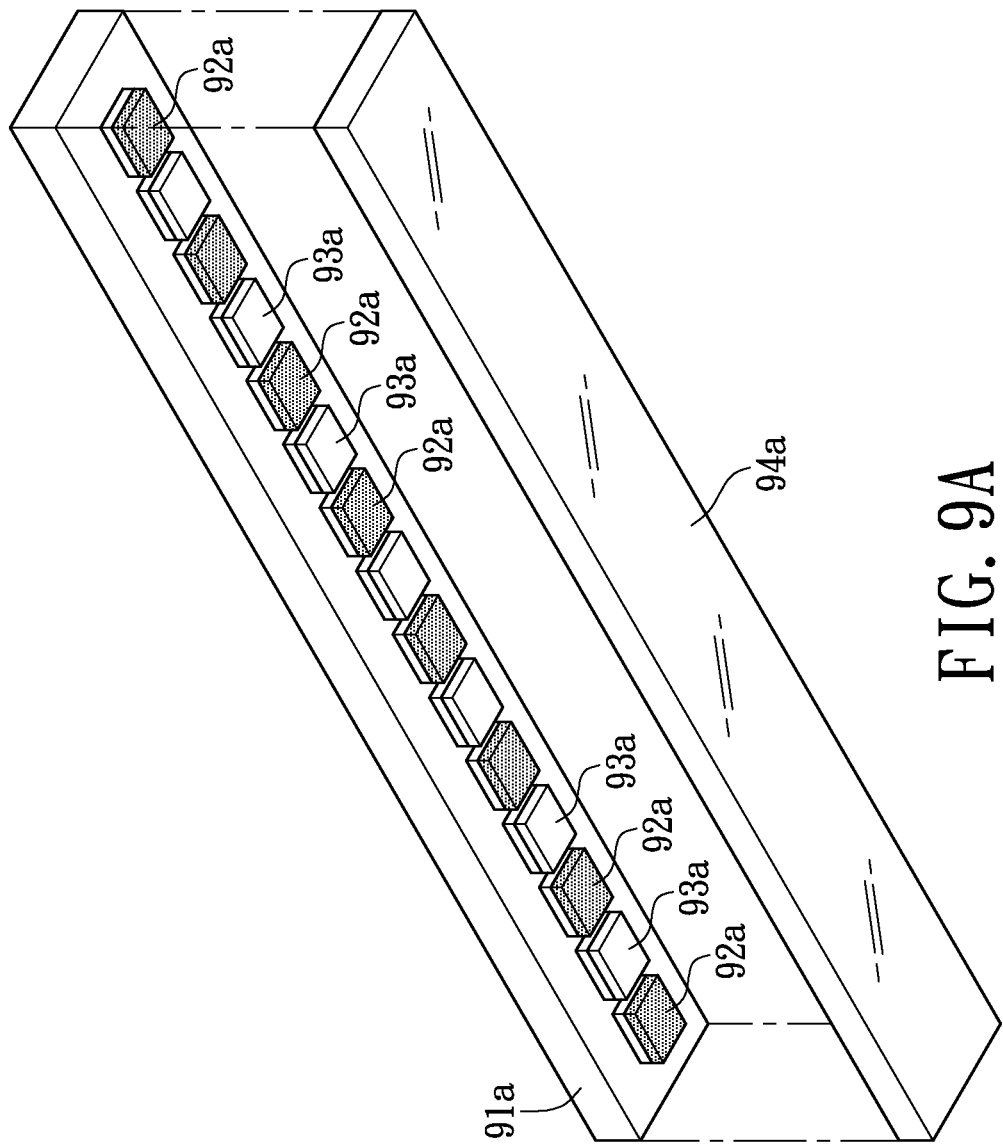
FIG. 9A is an application diagram of an exemplary embodiment of the present disclosure for a lighting apparatus.
Figure 9B:
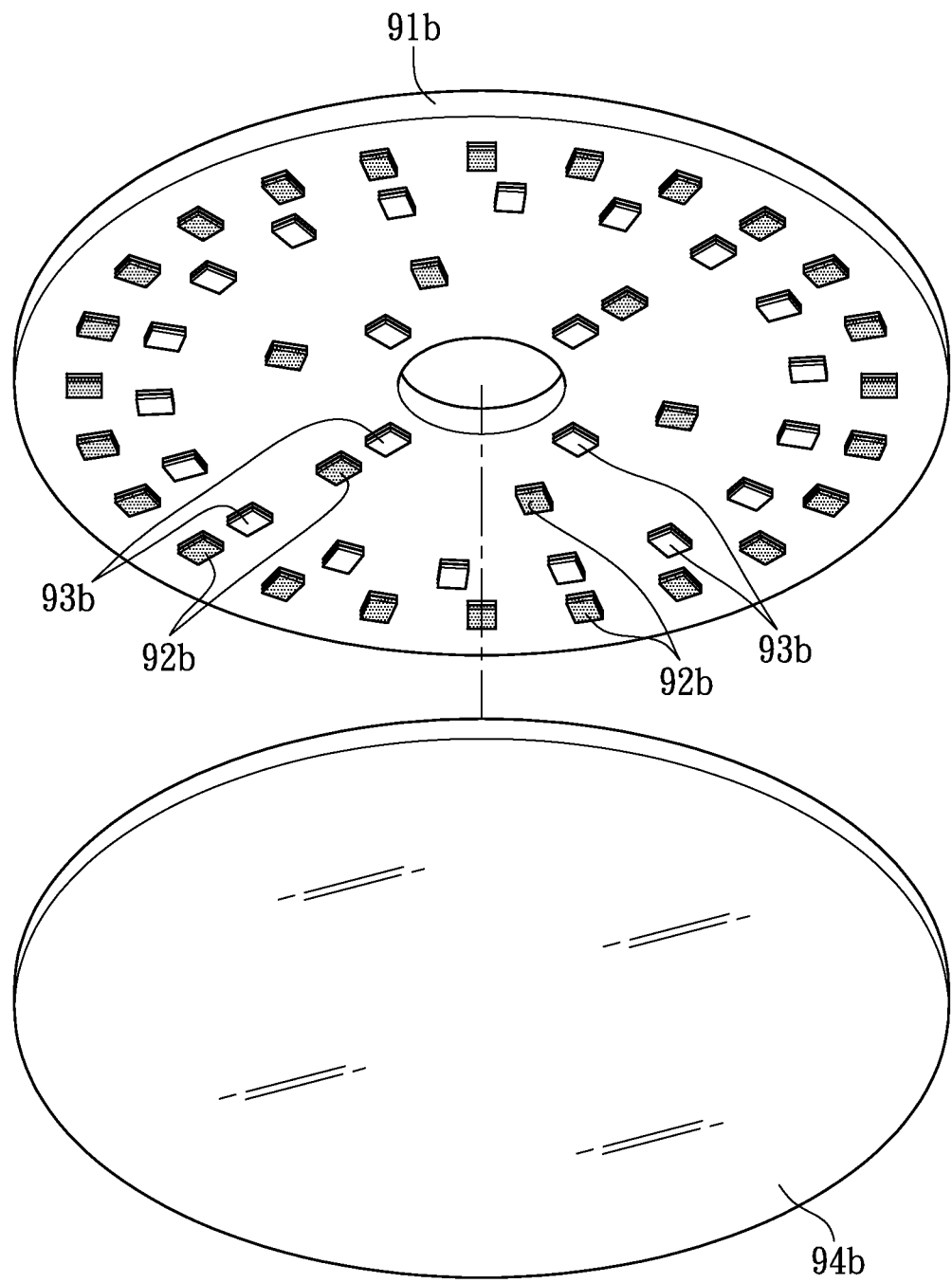
FIG. 9B is an application diagram of an exemplary embodiment of the present disclosure for a lighting apparatus.

The aforementioned microcontroller-based electronic switch can have many functions, such as on/off switch control, dimming control and color temperature tuning or management control, that are integrated in one without additional hardware complexity. This multifunctional electronic switch can be applied to a lighting apparatus. Please refer to FIG. 9A, a lighting apparatus having the microcontroller-based multifunctional electronic switch is provided. The lighting apparatus comprises a base 91a, a first lighting load 92a, a second lighting load 93a, a diffuser 94a and a microcontroller based electronic switch (not shown in the figure). The base 91a is for disposing the first lighting load 92a, the second lighting load 93a and the microcontroller based electronic switch which has been described in previous embodiments. The operation of the microcontroller based electronic switch related to lighting characteristic control of the first lighting load 92a and the second lighting load 93a can be referred to previous embodiments, thus the redundant information is not repeated. For diffusing or spreading out or scattering the different color temperature light emitted by the first lighting load 91a and the second lighting load 92a, a diffuser 94a is provided to cover the first lighting load 92a and the second lighting load 93a. Further, the first lighting load 92a and the second lighting load 93a can be alternatively disposed on the base 91a. As shown in FIG. 9B, the first lighting load 92a comprises a plurality of lighting elements, and the second lighting load 93a comprises a plurality of lighting elements, wherein a lighting element of the second lighting load 93a is inserted between the two adjacent lighting elements of the first lighting load 92a for obtaining uniform color temperature of the diffused light, but present disclosure is not limited thereto.

Another embodiment of the lighting apparatus can be referred to FIG. 9B. Due to the difference for the appearance of the lighting apparatus, the arrangement of the lighting elements of the first lighting load 92a and the lighting elements of the second lighting load 93a shown in FIG. 9B is different from that shown in FIG. 9A. As shown in FIG. 9B, the lighting elements of the first lighting load 92a and the lighting elements of the second lighting load 93a are both disposed in a circular arrangement. The lighting elements of the first lighting load 92a and the lighting elements of the second lighting load 93a constitute a plurality of concentric circles. The concentric circles of the first lighting load 92a and the concentric circles of the second lighting load 93a are interlaced for obtaining uniform color temperature of the diffused or blended light. However, the present disclosure is not restricted thereto. An artisan of ordinary skill in the art will appreciate how to arrange the first lighting load and the second lighting load covered by the diffuser to obtain the result of uniform color temperature of light.

Furthermore, although the above description of the exemplary embodiments takes infrared ray sensor as a means for detecting user's motion and generating sensing signal, the technology of the present disclosure has no restriction on the types of detection method used. There are quite a few detection methods including touch or touchless means that can be applied to the present invention of the multifunctional electronic switch such as an infrared ray sensor (touchless interface), an electrostatic induction sensor (also touchless interface), a conduction based touch sensor (direct touch interface), or a push button sensor (direct touch interface). Each detection method may require different motion signals to be played by the user but the core technology remains using the time length and format of the binary sensing signals as the message carrier for transmitting the user's choice of working mode. The microcontroller thereby decodes or interprets the received message carrying sensing signals according to the software program written in the OTPROM, recognizes the working mode selected by the user and activates the corresponding loop of subroutine for performance execution.

Similar to the infrared ray sensor, the electrostatic induction sensor can also create a touchless interface. The electrostatic induction sensor generally comprises a copper sheet sensing unit with adequately design shape and packaged with non-conductive material. Such copper sheet sensing unit is further electrically connected to a signal generating circuit similar to the infrared detection sensor unit. The copper sensing unit serves as an anode pole and the human body (normally refers to finger or hand) serves as a cathode pole to form a configuration of a capacitor. When the user's hand is approaching the copper sensing unit, the electric charges are being gradually induced and built up on the surface of the copper sensing unit with increasing density. Consequently, the copper sensing unit changes its electric state from zero voltage state to a growing voltage state. Such voltage level will continue to grow as the user's hand moving closer and closer to the copper sensing unit till reaching a designed threshold point which will trigger the detection circuit to generate a low voltage sensing signal. The distance between the copper sensing unit and the space point where the threshold voltage incurs is defined as the effective detecting zone. Similarly but reversely when the user's hand is moving out from an operative point of the detecting zone of the copper sensing unit, the voltage level will continue to decline till passing the designed threshold point which will trigger the cutoff of the low voltage sensing signal. The time length of the low voltage sensing signal so generated or in other words the time period between moving in and moving out the effective detecting zone can be designed to represent the selection of different working modes. If the time length is shorter than a preset time interval, it means the user's selection is to perform the on/off switch control mode; if the time length is longer than a preset time interval, it means the user's selection is to perform the diming or power level control mode; if two or more low voltage sensing signals are consecutively generated within a preset time interval, in other words the user's hand moving in and out the detecting zone twice or swing across the detecting zone back and forth, it means the user's selection is to perform the color temperature management mode.

For direct touch detection sensors, such as a touch sensor (for example a touch pad) or a push button detection sensor, one touch on the conductive base or one instant press on the control button within a preset time interval will trigger the generation of a single sensing signal which will cause the microcontroller to execute the subroutine of the on/off switch control mode; a long touch on a conductive base or a long press on a control button longer than the preset time interval will trigger the generation of a single sensing signal with time length longer than the preset time interval and the microcontroller responsively will execute the subprogram of dimming control mode. Double instant touches on the conductive base or double instant press on the control button within a preset time interval will trigger the generation of two consecutive sensing signals which will cause the microcontroller to execute the subroutine of color temperature management mode.

FIG. 10A and FIG. 10B together provide a good show case to prove the value of the user friendly concept of the present invention. Picture shown in FIG. 10A is a popular piece of under cabinet light with LED as light source. A manual on/off control switch is built on the right hand side of the rectangular housing and a dimming knob is built on the front panel facing downward. Under cabinet lights are always installed underneath the kitchen cabinets to provide sufficient indirect illumination to the user to do the kitchen work. The under cabinet lights and the kitchen cabinet are always installed at approximately the breast level of the users for the convenience of doing kitchen work so that the users can comfortably do the kitchen work without bending their body and having to work in a glaring environments. The current market piece as shown in FIG. 10A is not an user friendly device; the user has to either use his or her hand to blindly search the locations of the on/off switch and the dimming knob or to bend his or her body to find the exact locations of the two control units for operation. Additionally, the direct touch to control the on/off switch and dimmer also brings up concerns of contagion and contamination in preparing food in kitchen area and the housewives may have to wash their hands more frequently than necessary.

FIG. 10B is an application of the present invention for a LED under cabinet light featured with a touchless interface between the user and the under cabinet light. A motion of single swing of user's hand across the detecting zone of the microcontroller based electronic switch $1b$ will activate the on/off switch mode alternately turning on and turning off the under cabinet light $2b$. A motion of placing user's hand in the detecting zone exceeding a preset time interval will activate the dimming mode to allow selection of brightness or power level. And a motion of double swings of user's hand across the detecting zone within a preset time interval will activate the color temperature tuning mode to provide the user a possibility to select a desired illumination color temperature. The three basic working modes can be easily managed with simple motions played by the user without the hassles of having to blindly search the control switch and dimming knob, or to bend body to find the location of the control elements or to frequently wash hands to avoid concerns of contagion and contamination in preparing food. This is truly a very user friendly exemplary embodiment of the present disclosure compared with what are currently being sold in the market as shown in FIG. 10A.

Figure 10C:
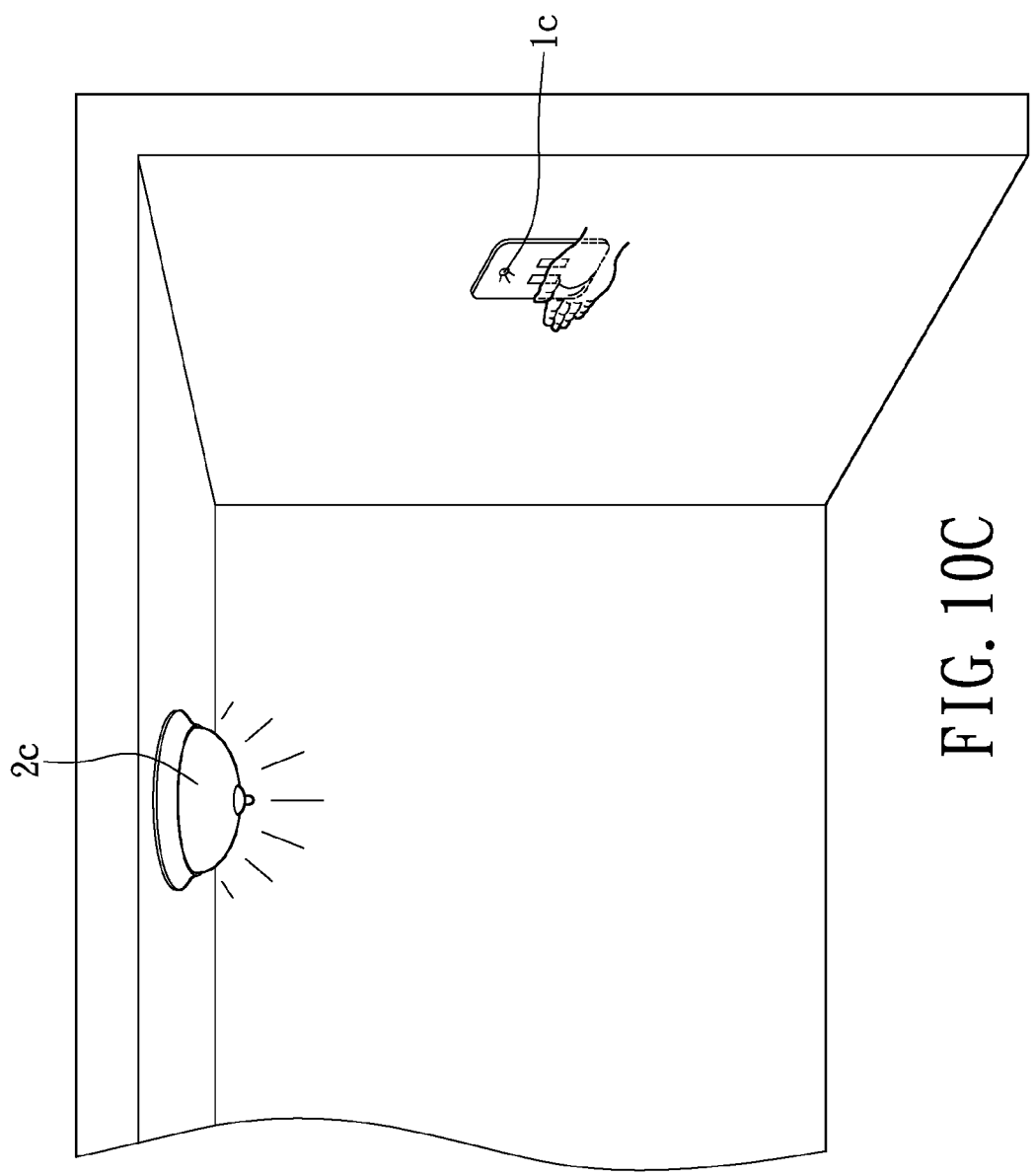
FIG. 10C is an application diagram of an exemplary embodiment of the present disclosure for a wall switch construction electrically connected to a ceiling light for the performance of three working modes.

FIG. 10C is another application of the present invention for a wall switch construction electrically connected to a ceiling light for the performance of three working modes. A motion of single swing across the detecting zone in front of the wall switch $1c$ by user's hand within a preset time interval will activate the on/off switch mode alternately turning on and turning off the ceiling light $2c$. A motion of placing user's hand in front of the wall switch $1c$ and stay in the detecting zone for a time period longer than a preset time interval will activate the dimming mode to allow the user to select the desired brightness. And a motion of double swings across the detecting zone within a preset time interval will activate the performance of the color temperature management mode to provide the user a convenient way to select a desired illumination color temperature. This new wall switch when compared with conventional switch represents a very user friendly innovation from the easy operation point of view. The conventional touch based wall switch is also a virus gathering spot because of use by many users and the issue of contagion and contamination is always a valid concern even outside the surgical space.

Figure 10D:
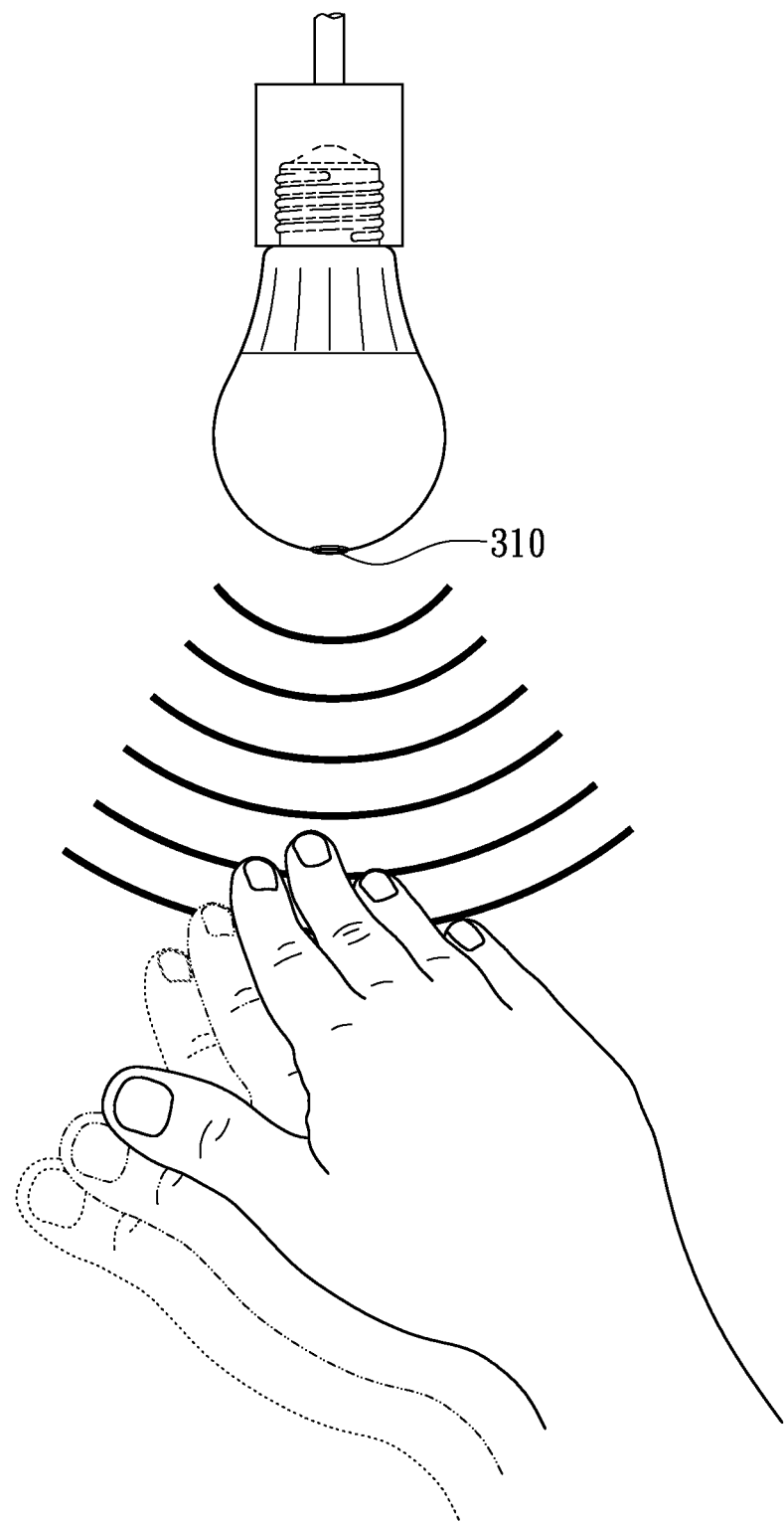
FIG. 10D is another application diagram of an exemplary embodiment of the present disclosure for a lighting apparatus with a diffuser of hollow body accommodating the lighting loads and the microcontroller based electronic switch.
Figure 10E:
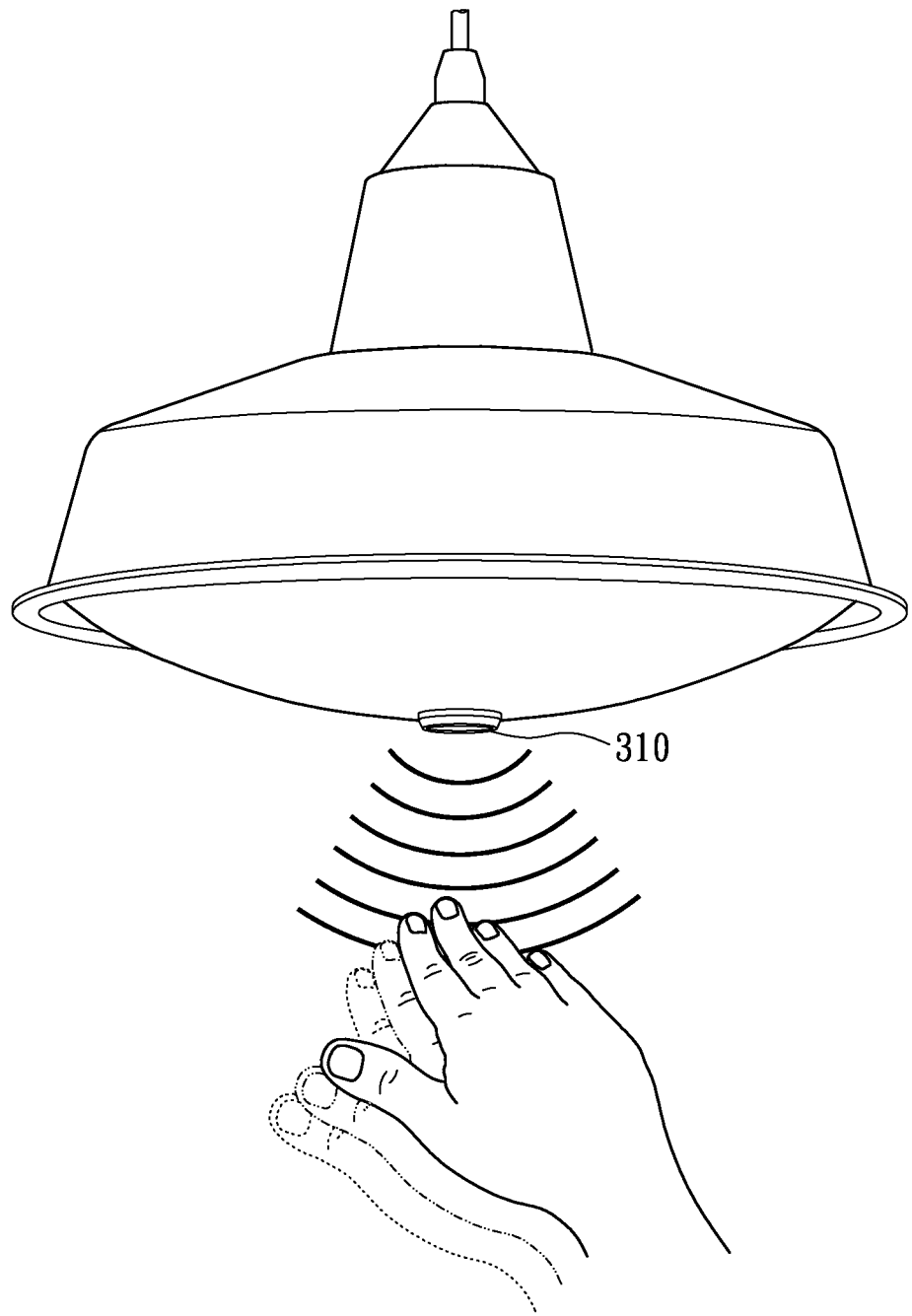
FIG. 10E is another application diagram of an exemplary embodiment of the present disclosure for a lighting apparatus with a diffuser of hollow body accommodating the lighting loads and the microcontroller based electronic switch.

FIG. 10D is another application of the present invention for a lighting apparatus with a diffuser of hollow body accommodating the lighting loads and the microcontroller based electronic switch. The diffuser is furthered bonded with a metallic threaded cap with bipolar construction for connecting with a power socket. FIG. 10E is a similar art with a flat diffuser bonded with a metal shade to accommodate the lighting loads and the microcontroller based electronic switch. Both have an infrared ray sensor 310 positioned at the bottom of the diffuser to form a short detection zone for an user to play motion signals for performing the multi functions of controlling on/off mode, dimming mode, color temperature tuning mode or delay shutoff mode.

Figure 11A:
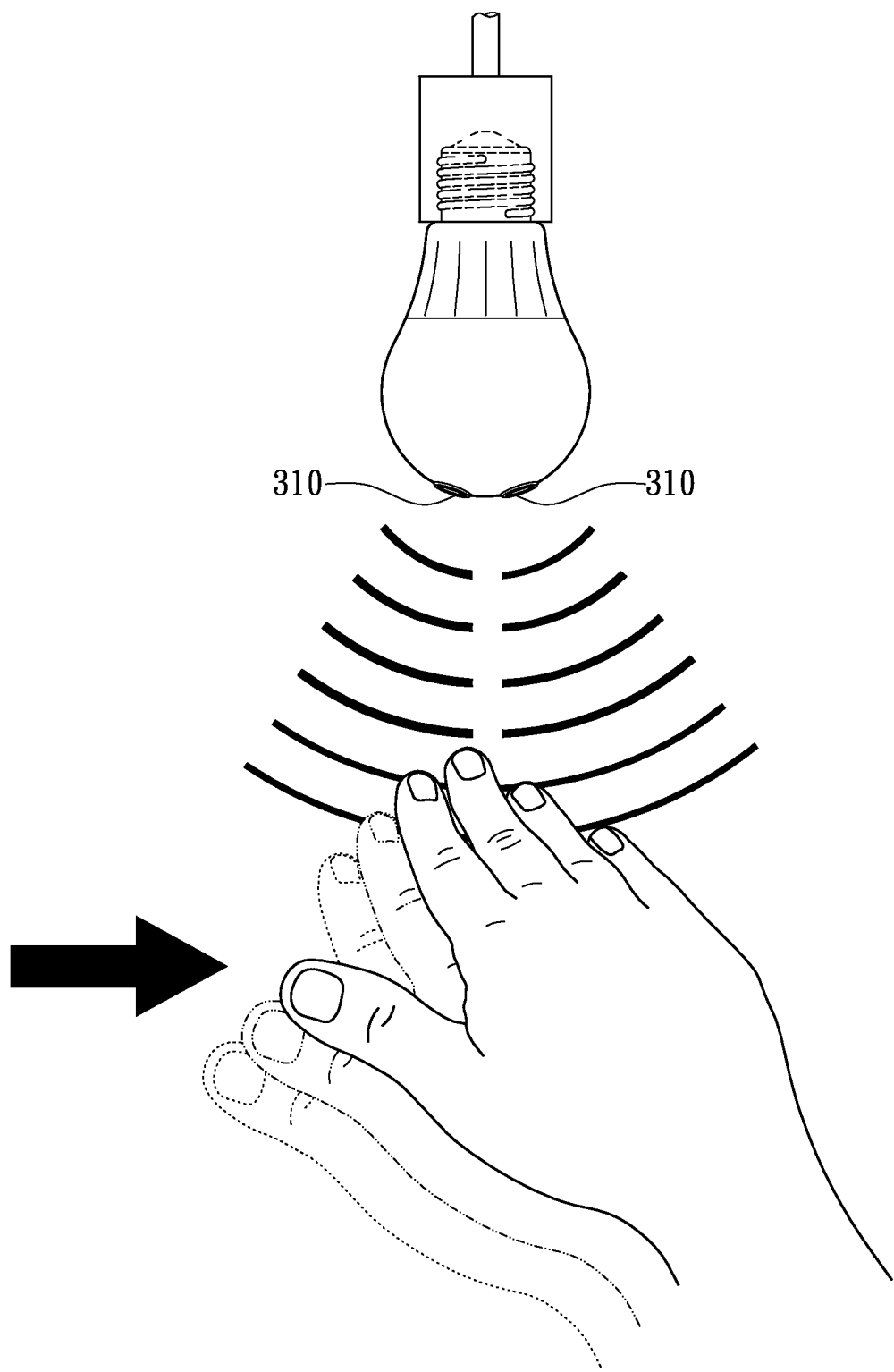
FIG. 11A is another application diagram of an exemplary embodiment of the present disclosure for the direction of motion path detected by an infrared ray sensor.
Figure 11B:
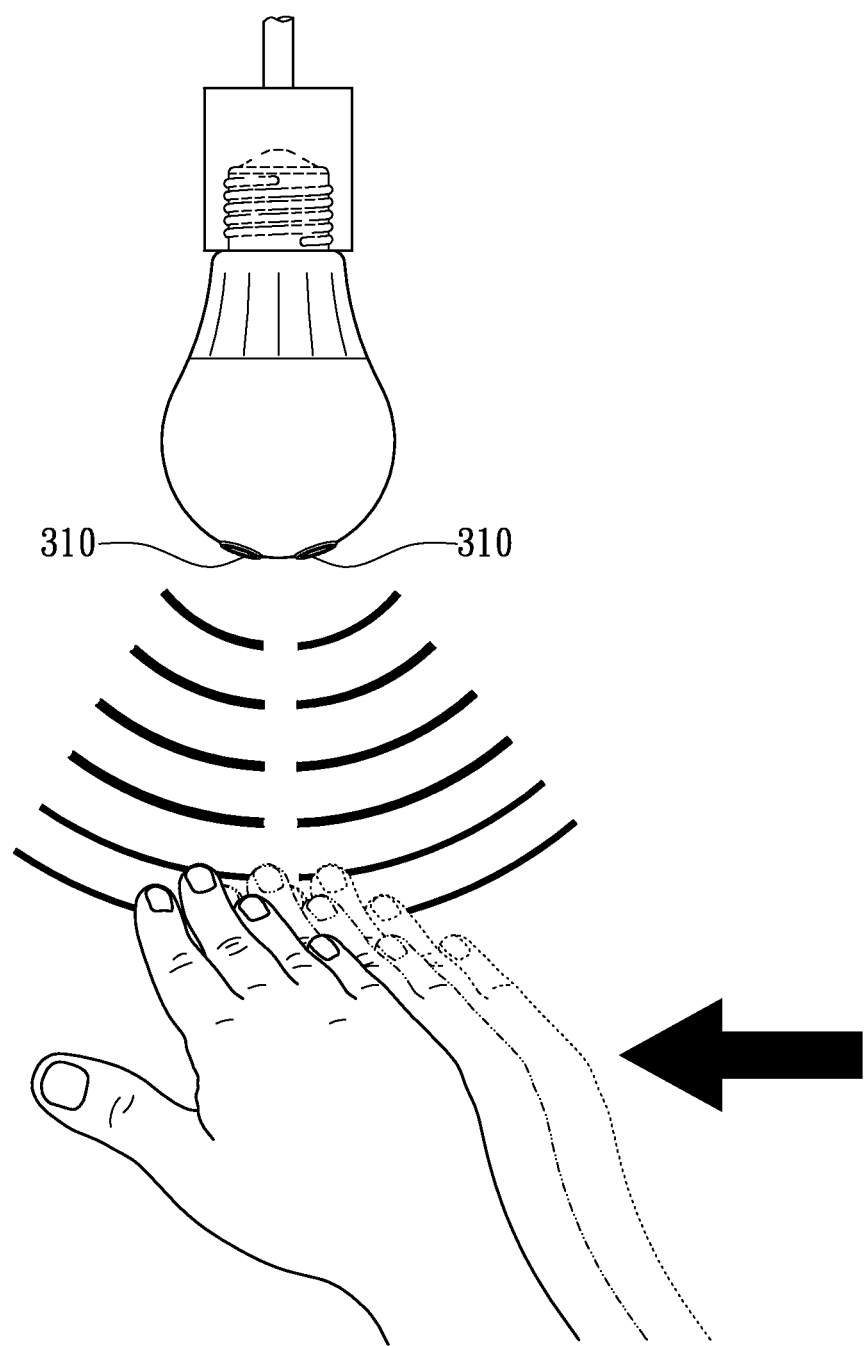
FIG. 11B is another application diagram of an exemplary embodiment of the present disclosure for the direction of motion path detected by an infrared ray sensor.
Figure 11C:
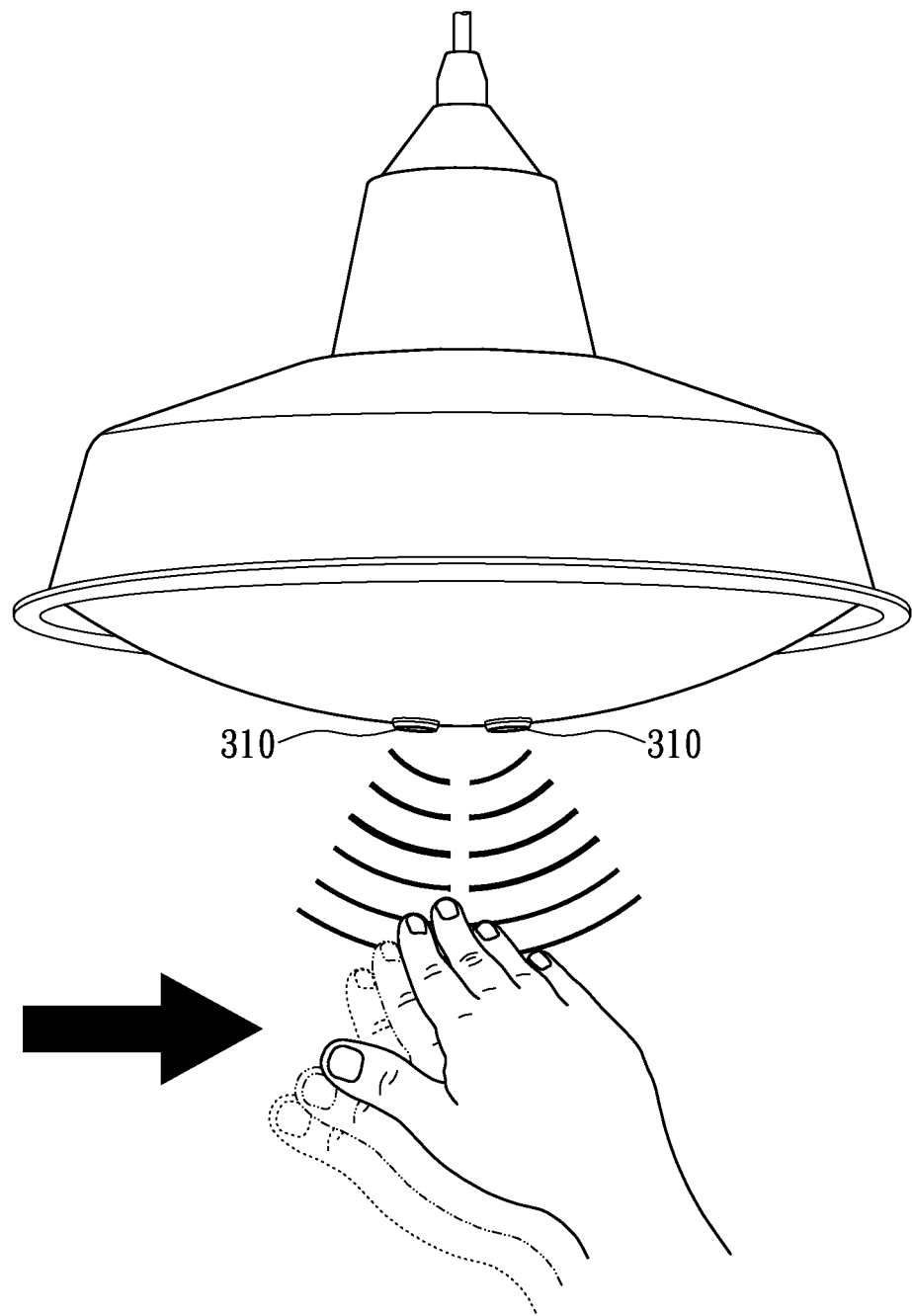
FIG. 11C is another application diagram of an exemplary embodiment of the present disclosure for the direction of motion path detected by an infrared ray sensor.
Figure 11D:
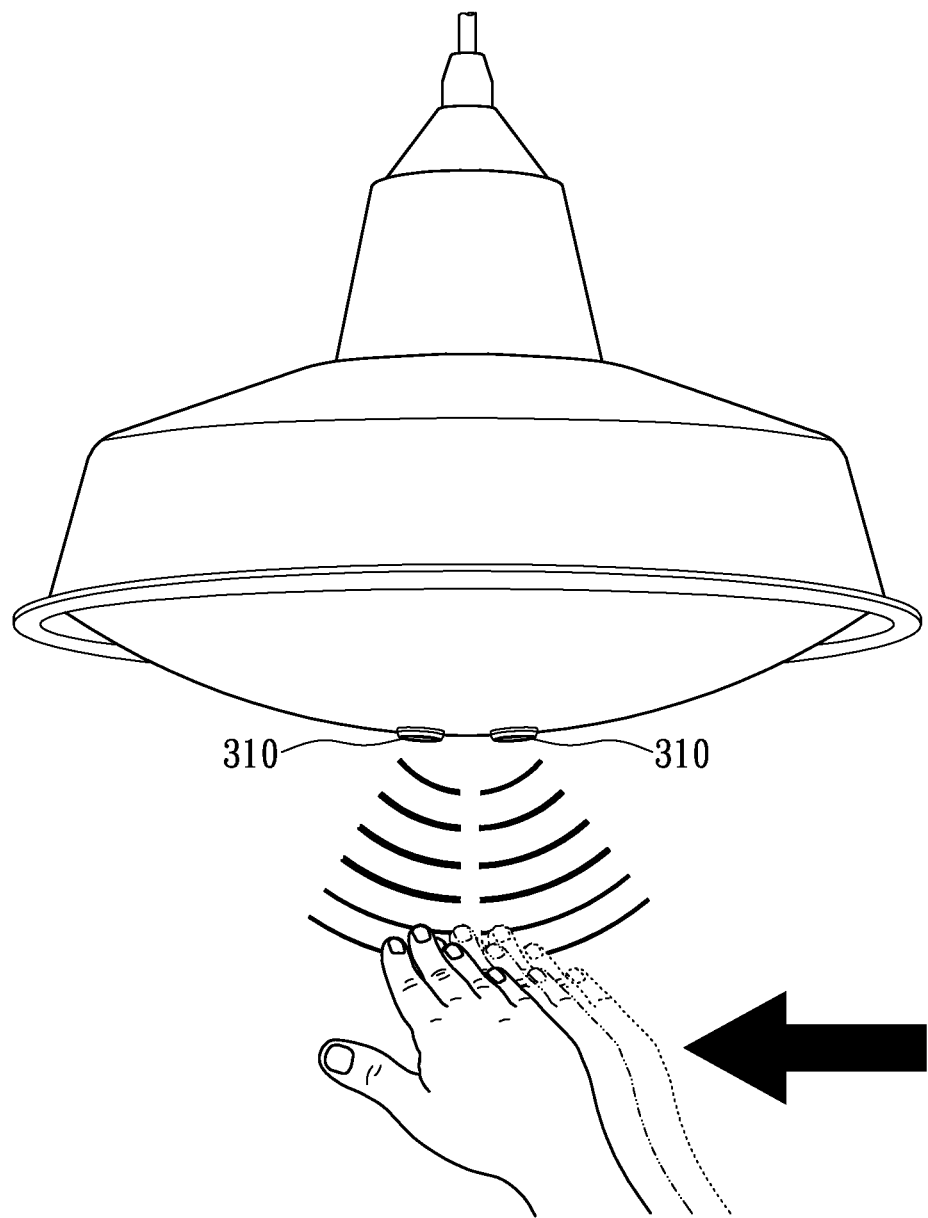
FIG. 11D is another application diagram of an exemplary embodiment of the present disclosure for the direction of motion path detected by an infrared ray sensor.

FIGS. 11A-D are another exemplary embodiments of the present invention using the aforementioned dual detection means technology for generating message carrying sensing signal to control a lighting apparatus. The dual detection means technology is based on two detection means which are respectively connected with two pins of a microcontroller in an electronic switch to control a lighting apparatus, such as, one first detection means generating message carrying sensing signal to control the color temperature of illumination and one second detection means generating message carrying sensing signal to control the light intensity of illumination. The dual detection means technology can be constructed in two arrangements: the first arrangement is to install the first detection means on one side (left side for instance) of the lighting apparatus and install the second detection means on the other side (right side) of the lighting apparatus. For instance, in FIG. 10B, the detection means 1b being an infrared ray sensor in the center can be relocated to the left side near the end cap as the first detection means to operate the light intensity control subroutine of microcontroller, a second infrared ray sensor as the second detection means is added and installed on the other end of the light apparatus to operate the color temperature control subroutine. The second arrangement is to have two detection means, here, two infrared ray sensors 310, aligned next to each other along the direction of motion path as shown in FIG. 11A and FIG. 11B, or in FIG. 11C and FIG. 11D. A hand swing from left side to enter the detecting zones formed by the two infrared ray sensors 310, as shown in FIG. 11A and FIG. 11C, will cause the first infrared ray sensor of the electronic switch to first detect the motion signal before the second infrared ray sensor can detect the same motion signal, the first infrared ray sensor will thereby generate a voltage sensing signal, the microcontroller with a pin connected with the first infrared ray sensor accordingly interprets such voltage sensing signal to activate a subroutine to operate the light intensity control mode. Thus, a first hand-swing from the left side to swing across the detecting zones will turn on the light, a second left side started hand swing will alternately change the light to perform a different state of light intensity including off mode, a left side started hand swing to enter the detecting zones and stay for a time length longer than a preset time interval will activate a free running dimming cycle for the user to select the desired light intensity. Similarly but contrarily in terms of direction for playing motion signal, a right side started hand swing to swing across the detecting zones formed by the two infrared ray sensors, as shown in FIG. 11B and FIG. 11D, will cause the second infrared ray sensor to first detect the motion signal before the first infrared ray sensor can detect such motion signal, the second infrared ray sensor thereby will generate another voltage sensing signal sending to the microcontroller of the electronic switch, the microcontroller with another pin connected to the second infrared ray sensor accordingly operates to activate a different subroutine of the microcontroller to operate the color temperature tuning mode. Thus, a right side started motion signal to swing across the detecting zones formed by the two infrared ray sensors will turn on the light to perform the highest color temperature mode, a second right side started motion signal to swing across the detecting zones will alternately change the light to perform a different state of programmed color temperatures including the lowest color temperature mode, a right hand started motion signal to enter and stay in the detecting zone for a time length longer than a preset time interval will activate a free running color temperature tuning cycle for the user to select a desired color temperature for the light. Also, when the hand (or an object) leaves the infrared ray detecting zones, the infrared ray sensors deliver a second voltage sensing signal to terminate the corresponding subroutine.

The present invention of the microcontroller based electronic switch can be extensively used in the control of lighting performance for many lighting applications. Regardless the diversity of lighting styles and purposes the applications can be simply grouped into three main categories of application based on the installation location of the present invention in relation with the lighting devices used as follows:

1) The microcontroller based electronic switch is installed inside a wall electric outlet for controlling a remotely located lighting apparatus which users are unable to reach to play motion control. FIG. 10C is a representative example.

2) The microcontroller based electronic switch is installed inside the housing of a lighting apparatus which users are able to reach and play motion control. FIG. 10B of a under cabinet light is a representative example.

3) The microcontroller based electronic switch is directly installed inside a light emitting device with a detecting sensor hiding behind a diffuser and a detecting zone is formed outside nearby the diffuser. FIG. 10D is a light bulb application with a microcontroller electronic switch built inside the bulb and an infrared ray detecting sensor installed at bottom of the bulb to form a infrared detecting zone near by the bottom of the light bulb. FIG. 10E is a pendant application with an infrared ray detection sensor built inside and an infrared ray detecting sensor installed at the bottom of a flat diffuser. Both are representative examples classified as detecting sensor installed at bottom of diffuser to form a detecting zone near by the diffuser.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A microcontroller based electronic switch for detecting an external motion signal, comprising:
   a first controllable switching element, electrically connectable to a first lighting load for emitting light with a first color temperature and a power source;
   a second controllable switching element, electrically connectable to a second lighting load for emitting light with a second color temperature and the power source;
   a detection means, for detecting an external motion signal played by a user and converting said external motion signal into a message carrying sensing signal; and
   a microcontroller with program codes to read and interpret the message carrying sensing signal generated by said detection means, wherein said microcontroller is electrically connected between said first controllable switching element and said detection means, said microcontroller is electrically connected between said second controllable switching element and said detection means, said microcontroller controls a conduction state or cutoff state of said first controllable switching element and said second controllable switching element according to said message carrying sensing signal generated by said detection means;
   wherein the detection means is a touchless interface forming a defined detecting zone for detecting a motion of an object moving into and leaving said defined detecting zone, a circuitry responsively generates a first voltage sensing signal with a time length corresponding to a time interval of the object entering and staying in said defined detecting zone; when the object leaves said defined detecting zone, the detection means delivers a second voltage signal;
   wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

2. The microcontroller based electronic switch according to claim 1, wherein the sum of X and Y is a constant value.

3. The microcontroller based electronic switch according to claim 1, wherein the first controllable switching element and second controllable switching element are bi-directional controllable semiconductor switching elements, the power source is an AC power source, the microcontroller based electronic switch further comprises:
   a zero-crossing-point detector, electrically connected to the AC power source and the microcontroller;
   wherein the microcontroller produces a zero voltage or a zero-crossing-point time-delay voltage pulse to control the conduction or cut-off state of the bi-directional controllable semiconductor switching elements according to the message carrying sensing signal.

4. The microcontroller based electronic switch according to claim 3, wherein the bi-directional controllable semiconductor switching elements are triodes for alternating current (triac).

5. The microcontroller based electronic switch according to claim 3, wherein the first lighting load and the second lighting load are light-emitting diode modules, AC-LEDs or screwed-in LED bulbs, wherein said light-emitting diode module comprises a full-wave rectifier bridge and a plurality of light-emitting diodes in series connected between the two terminals of the rectifier bridge output port.

6. The microcontroller based electronic switch according to claim 1, wherein the first controllable switching element and second controllable switching element are uni-directional controllable semiconductor switching elements, the power source is a DC power source, the microcontroller produces a pulse-width-modulation voltage signal to control the conduction or cut-off state of the uni-directional controllable semiconductor switching elements according to the message carrying sensing signal.

7. The microcontroller based electronic switch according to claim 6, wherein the uni-directional controllable semiconductor switching elements are bipolar junction transistors (BJTs) or metal oxide semiconductor field effect transistors (MOSFETs).

8. The microcontroller based electronic switch according to claim 6, wherein the first lighting load and the second lighting load are light-emitting diodes.

9. The microcontroller based electronic switch according to claim 1, wherein when said microcontroller receives the first voltage sensing signal generated by the detection means, said microcontroller accordingly manages to output control signals to the first controllable switching element and the second controllable switching element to alternately perform one of programmed combinations of conduction states between the first controllable switching element and the second controllable switching element according to a sequence programmed.

10. The microcontroller based electronic switch according to claim 9, wherein the first color temperature is a low color temperature, the second color temperature is a high color temperature, wherein the programmed combinations include at least three combination modes; wherein the first combination mode is where the first controllable switching element is in a complete conduction state while the second controllable switching element is in a cutoff state with the first lighting load performing the low color temperature, wherein the second combination mode is where the first controllable switching element is in a cutoff state while the second controllable switching element is in a complete conduction state with the second lighting load performing the high color temperature, wherein the third combination mode is where both the first controllable switching element and the second controllable switching element are in cutoff state with the first and the second lighting loads being turned off.

11. The microcontroller based electronic switch according to claim 1, wherein when said microcontroller receives the message carrying sensing signal, said microcontroller checks the time length of the first voltage sensing signal, if the time length is shorter than a preset time interval the microcontroller accordingly operates a first working mode, if the time length of the first voltage sensing signal is longer than the preset time interval the microcontroller accordingly manages to perform a second working mode.

12. The microcontroller based electronic switch according to claim 11, wherein the first working mode is to alternately perform between the first color temperature and the second color temperature, the first color temperature is low color temperature, the second color temperature is high color temperature, wherein when the first controllable switching element is in a full conduction state and the second controllable switching element is in a full cutoff state, the first lighting load consequently demonstrates the low color temperature of illumination characteristic, when the first controllable switching element is in the full cutoff state and the second controllable switching element is in the full conduction state, the second lighting load consequently demonstrates the high color temperature of illumination characteristic.

13. The microcontroller based electronic switch according to claim 11, wherein for the second working mode, the first controllable switching element gradually changes its conduction rate from the full conduction state to the full cutoff state while the second controllable switching element being simultaneously changed from the full cutoff state to the full conduction state, then the first controllable switching element continues to gradually change from the full cutoff state to the full conduction state with the second controllable switching element acting in reverse direction from the full conduction state to the full cutoff state to complete a color temperature tuning cycle according to the time length of the first voltage sensing signal, the tuning process ceases at the expiration of the time length of the first voltage sensing signal, thus the mingled effect of color temperature as a consequence changes continuously from the lowest color temperature to the highest color temperature and then from the highest color temperature to the lowest color temperature during the color temperature tuning cycles and the time length of the first voltage sensing signal determines where the color temperature characteristic ends up.

14. The microcontroller based electronic switch according to claim 11, wherein the preset time interval is between 1 second and 3 seconds.

15. The microcontroller based electronic switch according to claim 1 wherein when the time length of the first voltage sensing signal is shorter than a preset time interval, said microcontroller controls the conduction or cutoff state of both said first controllable switching element and second controllable switching element alternately, when the time length of the first voltage sensing signal is longer than the preset time interval, said microcontroller continuously outputs control signals to gradually change the conduction rates of said first controllable switching element and second controllable switching element respectively from maximum conduction rate to minimum conduction rate or from minimum conduction rate to maximum conduction rate.

16. The microcontroller based electronic switch according to claim 1, wherein when said microcontroller receives the message carrying sensing signal, said microcontroller operates at least three working modes in response to sensing signals of different format types characterized by the time length of the first voltage sensing signal, wherein the first working mode in response to a first type sensing signal is on/off switch control mode used to control the conduction or cutoff state of both said first controllable switching element and second controllable switching element, the second working mode in response to a second type sensing signal is dimming control mode used to control the conduction rate of both said first controllable switching element and second controllable switching element, and the third working mode in response to a third type sensing signal is used to manage the color temperature of the mingled light generated from the first and second lighting loads by controlling the conduction rates of the said first and second controllable switching elements to alternately reverse the conduction status between the first controllable switching element and the second controllable switching element.

17. A lighting apparatus comprising:
a first lighting load for emitting light with a first color temperature;
a second lighting load for emitting light with a second color temperature;
a diffuser, covering the first lighting load and the second lighting load to create a diffused light with a mingled color temperature; and
a microcontroller based electronic switch electrically connected to the first lighting load and the second lighting load, the microcontroller based electronic switch comprising:
 a first controllable switching element, electrically connected between the first lighting load and a power source;
 a second controllable switching element, electrically connected between the second lighting load and the power source;
 a detection means, for detecting an external motion signal played by a user and converting said external motion signal into a message carrying sensing signal; and
 a microcontroller with program codes to read and interpret the message carrying sensing signal generated by said detection means, wherein said microcontroller is electrically connected between said first controllable switching element and said detection means, said microcontroller is electrically connected between said second controllable switching element and said detection means, said microcontroller controls a conduction state or cutoff state of said first controllable switching element and said second controllable switching element according to said message carrying sensing signal generated by said detection means;
wherein the detection means is a touchless interface forming a defined detecting zone for detecting a motion of an object moving into and leaving said defined detecting zone, a circuitry responsively generates a first voltage sensing signal with a time length corresponding to a time interval of the object entering and staying in said defined detecting zone; when the object leaves said defined detecting zone, the detection means delivers a second voltage signal;
wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

18. The lighting apparatus according to claim 17, wherein the sum of X and Y is a constant value.

19. The lighting apparatus according to claim 17, wherein the first controllable switching element and second controllable switching element are bi-directional controllable semiconductor switching elements, the power source is an AC power source, the microcontroller based electronic switch further comprises:
a zero-crossing-point detector, electrically connected to the AC power source and the microcontroller;
wherein the microcontroller produces a zero voltage or a zero-crossing-point time-delay voltage pulse to control the conduction or cut-off state of the bi-directional controllable semiconductor switching elements according to the message carrying sensing signal.

20. The lighting apparatus according to claim 19, wherein the bi-directional controllable semiconductor switching elements are triodes for alternating current (triac).

21. The lighting apparatus according to claim 17, wherein the first lighting load and the second lighting load are light-emitting diode modules, AC-LEDs or screwed-in LED bulbs, wherein said light-emitting diode module comprises a full-wave rectifier bridge and a plurality of light-emitting diodes in series connected between the two terminals of the rectifier bridge output port.

22. The lighting apparatus according to claim 17, wherein the first controllable switching element and second controllable switching element are uni-directional controllable semiconductor switching elements, the power source is a DC power source, the microcontroller produces a pulse-width-modulation voltage signal to control the conduction or cut-off state of the uni-directional controllable semiconductor switching elements according to the message carrying sensing signal.

23. The lighting apparatus according to claim 22, wherein the uni-directional controllable semiconductor switching elements are bipolar junction transistors (BJTs) or metal oxide semiconductor field effect transistors (MOSFETs).

24. The lighting apparatus according to claim 22, wherein the first lighting load and the second lighting load are light-emitting diodes.

25. The lighting apparatus according to claim 17, wherein when said microcontroller receives the first voltage sensing signal generated by the detection means, said microcontroller accordingly manages to output control signals to the first controllable switching element and the second controllable switching element to alternately perform one of programmed combinations of conduction states between the first controllable switching element and the second controllable switching element according to a sequence programmed.

26. The lighting apparatus according to claim 25, wherein the first color temperature is a low color temperature, the second color temperature is a high color temperature, wherein the programmed combinations include at least three combination modes; wherein the first combination mode is where the first controllable switching element is in a complete conduction state while the second controllable switching element is in a cutoff state with the lighting apparatus performing the low color temperature, wherein the second combination mode is where the first controllable switching element is in a cutoff state while the second controllable switching element is in a complete conduction state with the lighting apparatus performing the high color temperature, wherein the third combination mode is where both the first controllable switching element and the second controllable switching element are in cutoff state with the lighting apparatus being turned off.

27. The lighting apparatus according to claim 17, wherein when the time length of the first voltage sensing signal is shorter than a preset time interval, said microcontroller controls the conduction or cutoff state of both said first controllable switching element and second controllable switching element alternately, when the time length of the first voltage sensing signal is longer than the preset time interval, said microcontroller continuously outputs a control signal to gradually change the conduction rate of said first controllable switching element and second controllable switching element respectively from maximum conduction rate to minimum conduction rate or from minimum conduction rate to maximum conduction rate.

28. The lighting apparatus according to claim 17, wherein when said microcontroller receives the first voltage sensing signal, said microcontroller checks the time length of the first voltage sensing signal, if the time length is shorter than a preset time interval the microcontroller accordingly operates a first working mode, if the time length of the first voltage sensing signal is longer than the preset time interval the microcontroller accordingly manages to perform a second working mode.

29. The lighting apparatus according to claim 28, wherein the first working mode is to alternately perform between the first color temperature and the second color temperature, the first color temperature is low color temperature, the second color temperature is high color temperature, wherein when the first controllable switching element is in a full conduction state and the second controllable switching element is in a full cutoff state, the light consequently demonstrates the low color temperature of illumination characteristic, when the first controllable switching element is in the full cutoff state and the second controllable switching element is in the full conduction state, the lighting apparatus consequently demonstrates the high color temperature of illumination characteristic.

30. The lighting apparatus according to claim 28, wherein for the second working mode, the first controllable switching element gradually changes its conduction rate from the full conduction state to the full cutoff state while the second controllable switching element being simultaneously changed from the full cutoff state to the full conduction state, then the first controllable switching element continues to gradually change from the full cutoff state to the full conduction state with the second controllable switching element acting in reverse direction from the full conduction state to the full cutoff state to complete a color temperature tuning cycle according to the time length of the first voltage sensing signal, the tuning process ceases at the expiration of the time length of the first voltage sensing signal, thus the mingled effect of color temperature as a consequence changes continuously from lowest color temperature to the highest temperature during the color temperature tuning cycles and the time length of the first voltage sensing signal determines where the color temperature characteristic ends up.

31. The lighting apparatus according to claim 28, wherein the preset time interval is between 1 second and 3 seconds.

32. The lighting apparatus according to claim 17, wherein when said microcontroller receives the first voltage sensing signal, said microcontroller operates at least three working modes according to sensing signals of different format types characterized by the time length of the first voltage sensing signal, wherein the first working mode according to a first type sensing signal is on/off switch control mode used to control the conduction or cutoff state of both said first controllable switching element and second controllable switching element, the second working mode according to a second type sensing signal is dimming control mode used to control the conduction rate of both said first controllable switching element and second controllable switching element, and the third working mode according to a third type sensing signal is used to manage the color temperature of the light of the first and second lighting loads by controlling the conduction rates of said first and second controllable switching elements to alternately reverse the conduction status between the first controllable switching element and the second controllable switching element.

33. The lighting apparatus according to claim 17, wherein the touchless interface is an infrared sensor, and wherein the means for forming the defined detecting zone is a means for emitting infrared light, and the means for detecting the motions of the object entering and leaving said defined detecting zone is a means for detecting infrared light reflected from the object moving into said infrared detecting zone.

34. The lighting apparatus according to claim 17, wherein the diffuser is a hollow body accommodating the first lighting load, the second lighting load and the microcontroller based electronic switch, wherein the diffuser is bonded with a metallic cap with bipolar construction for connecting electrically to a power socket.

35. A lighting apparatus comprising:
   a first lighting load for emitting light with a first color temperature;
   a second lighting load for emitting light with a second color temperature;
   a diffuser, covering the first lighting load and the second lighting load to create a diffused light with a mingled color temperature; and
   a microcontroller based electronic switch electrically connected to the first lighting load and the second lighting load, the microcontroller based electronic switch comprising:
      a first controllable switching element, electrically connected between the first lighting load and a power source;
      a second controllable switching element, electrically connected between the second lighting load and the power source;
      a detection means, for detecting an external motion signal played by a user and converting said external motion signal into a message carrying sensing signal; and
      a microcontroller with program codes to read and interpret the message carrying sensing signal generated by said detection means, wherein said microcontroller is electrically connected between said first controllable switching element and said detection means, said microcontroller is electrically connected between said second controllable switching element and said detection means, said microcontroller controls a conduction state or cutoff state of said first controllable switching element and said second controllable switching element according to said message carrying sensing signal generated by said detection means;
   wherein the detection means is a touchless interface, and wherein the touchless interface is an electrostatic induction sensor comprising a copper sheet sensing unit with adequately designed shape and size to form an electrostatic induction detection zone for detecting a motion of an object entering and leaving said electrostatic induction detection zone; a circuitry responsively generates a first voltage sensing signal with a time length corresponding to a time interval of the object entering and staying in said electrostatic induction detecting zone; when the object leaves said electrostatic induction detecting zone, the detection means delivers a second voltage signal;

wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

36. A lighting apparatus comprising:
a first lighting load for emitting light with a first color temperature;
a second lighting load for emitting light with a second color temperature;
a diffuser, covering the first lighting load and the second lighting load to create a diffused light with a mingled color temperature; and
a microcontroller based electronic switch electrically connected to the first lighting load and the second lighting load, the microcontroller based electronic switch comprising:
  a first controllable switching element, electrically connected between the first lighting load and a power source;
  a second controllable switching element, electrically connected between the second lighting load and the power source;
  a detection means, for detecting an external motion signal played by a user and converting said external motion signal into a message carrying sensing signal; and
  a microcontroller with program codes to read and interpret the message carrying sensing signal generated by said detection means, wherein said microcontroller is electrically connected between said first controllable switching element and said detection means, said microcontroller is electrically connected between said second controllable switching element and said detection means, said microcontroller controls a conduction state or cutoff state of said first controllable switching element and said second controllable switching element according to said message carrying sensing signal generated by said detection means;
wherein the detection means is a direct touch interface connecting with a pin of the microcontroller, when the user contacts the touch interface for a time interval, a first voltage sensing signal is detected by the microcontroller which is the message carrying sensing signal having a first voltage with a time length corresponding to a time interval of the touch interface being contacted; when the user leaves the touch interface, the detection means delivers a second voltage signal;
wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

37. The lighting apparatus according to claim 36, wherein the sum of X and Y is a constant value.

38. The lighting apparatus according to claim 36, wherein the direct touch interface is a push button or a touch sensor.

39. A lighting apparatus comprising:
a first lighting load for emitting light with a first color temperature;
a second lighting load for emitting light with a second color temperature;
a diffuser, covering the first lighting load and the second lighting load to create a diffused light with a mingled color temperature;
a clock, providing time information to the microcontroller for managing variation of color temperature according to a programmed pattern of color temperature schedule; and
a microcontroller based electronic switch electrically connected to the first lighting load and the second lighting load;
wherein the microcontroller based electronic switch comprising:
  a first controllable switching element, electrically connected between the first lighting load and a power source;
  a second controllable switching element, electrically connected between the second lighting load and the power source;
  a detection means, for detecting an external motion signal played by a user and converting said external motion signal into a messaging carrying sensing signal; and
  a microcontroller with program codes to read and interpret the message carrying sensing signal generated by the detection means, wherein said microcontroller is electrically connected between said first controllable switching element and said detection means, said microcontroller is also electrically connected between said second controllable switching element and said detection means, said microcontroller with program codes is programmed to execute the tasks of managing the illumination characteristics of the lighting apparatus including light intensity and light color temperature;
wherein said microcontroller controls a conduction state, cutoff state or conduction rate of said first controllable switching element and said second controllable switching element according to a subroutine programmed for automatic tuning of color temperature based on the time information provided by said clock and according to said message carrying sensing signal generated by the detection means;
wherein the detection means is a touchless interface forming a defined detecting zone for detecting a motion of an object entering and leaving said defined detecting zone, a circuitry responsively generates a first voltage sensing signal with a time length corresponding to a time interval of the object entering and staying in said defined detecting zone, when the object leaves said defined detecting zone, said detection means delivers a second voltage sensing signal;

wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

40. The lighting apparatus according to claim 39, wherein the sum of X and Y is a constant value.

41. The lighting apparatus according to claim 39, wherein when said microcontroller receives the first voltage sensing signal, said microcontroller manages to output control signals to the first controllable switching element and the second controllable switching element to control the conduction or cutoff state of both said first controllable switching element and said second controllable switching element alternately.

42. The lighting apparatus according to claim 39, wherein when the time length of the first voltage sensing signal is shorter than a preset time interval, said microcontroller controls the conduction or cutoff state of both said first controllable switching element and said second controllable switching element alternately, when the time length of the first voltage sensing signal is longer than the preset time interval, said microcontroller continuously output a control signal to gradually change the conduction rate of both said first controllable switching element and said second controllable switching element from maximum conduction rate to minimum conduction rate, and continuously from minimum conduction rate to maximum conduction rate for completing a dimming cycle, the moment at which the first voltage sensing signal is changed to a second voltage sensing signal during a dimming cycle is the dimming end point for locking in the conduction rate of both said first controllable switching element and second controllable switching element and the time length of the first voltage sensing signal determines where the light intensity of the lighting apparatus ends up.

43. The lighting apparatus according to claim 39, wherein the touchless interface is an infrared ray sensor or an electrostatic induction sensor.

44. A lighting apparatus comprising:
a first lighting load for emitting light with a first color temperature;
a second lighting load for emitting light with a second color temperature;
a diffuser, covering the first lighting load and the second lighting load to create a diffused light with a mingled color temperature;
a clock, providing time information to the microcontroller for managing variation of color temperature according to a programmed pattern of color temperature schedule; and
a microcontroller based electronic switch electrically connected to the first lighting load and the second lighting load;
wherein the microcontroller based electronic switch comprising:
a first controllable switching element, electrically connected between the first lighting load and a power source;
a second controllable switching element, electrically connected between the second lighting load and the power source;
a detection means, for detecting an external motion signal played by a user and converting said external motion signal into a messaging carrying sensing signal; and
a microcontroller with program codes to read and interpret the message carrying sensing signal generated by the detection means, wherein said microcontroller is electrically connected between said first controllable switching element and said detection means, said microcontroller is also electrically connected between said second controllable switching element and said detection means, said microcontroller with program codes is programmed to execute the tasks of managing the illumination characteristics of the lighting apparatus including light intensity and light color temperature;
wherein said microcontroller controls a conduction state, cutoff state or conduction rate of said first controllable switching element and said second controllable switching element according to a subroutine programmed for automatic tuning of a color temperature based on a time information provided by said clock and according to said message carrying sensing signal generated by the detection means;
wherein said detection means is a direct touch interface electrically connected with said microcontroller, wherein when the user contacts the direct touch interface for a time interval, a first voltage sensing signal is detected by said microcontroller with a signal time length corresponding to a time interval which the direct touch interface being continuously contacted, when the user withdraws from the direct touch interface, said detection means delivers a second voltage sensing signal;
wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

45. The lighting apparatus according to claim 44, wherein the sum of X and Y is a constant value.

46. A microcontroller based electronic switch for detecting an external motion signal, comprising:
a first controllable switching element, electrically connectable to a first load and a power source;
a second controllable switching element, electrically connectable to a second load and the power source;
a first detection means and a second detection means, respectively for detecting an external motion signal played by a user and converting said external motion signal into a message carrying sensing signal; and
a microcontroller with program codes to read and interpret the message carrying sensing signal generated by said first and second detection means, wherein said microcontroller is electrically connected between said first controllable switching element and said first and second detection means, said microcontroller is electrically connected between said second controllable switching element and said first and second detection means, said microcontroller controls a conduction state or cutoff state of said first controllable switching element and said second controllable switching element according to said message carrying sensing signal generated by said first and second detection means;

wherein the first detection means is a first infrared ray sensor and the second detection means is a second infrared ray sensor, aligned next to each other along the direction of external motion path, each comprising the same means for emitting infrared light to form two defined infrared ray detecting zones neighboring to each other and the same means for detecting infrared light reflected from an object moving into said two neighboring detecting zones, a circuitry responsively generates two different types of first voltage sensing signal featuring the different sensing sequences between the first infrared ray sensor and the second infrared ray sensor, and the time length corresponding to the time interval the object staying in the two detection zones; when the object leaves the infrared ray detecting zones, the infrared ray sensors deliver a second voltage sensing signal;

wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

47. The microcontroller based electronic switch according to claim 46, wherein the first load is a first lighting load for emitting light with a first color temperature and the second load is a second lighting load for emitting light with a second color temperature.

48. A microcontroller based electronic switch for detecting an external motion signal, comprising:

a first controllable switching element, electrically connectable to a first lighting load for emitting light with a first color temperature and a power source;

a second controllable switching element, electrically connectable to a second lighting load for emitting light with a second color temperature and the power source;

a detection means, for detecting an external motion signal played by a user and converting said external motion signal into a message carrying sensing signal; and a microcontroller with program codes to read and interpret the message carrying sensing signal generated by said detection means, wherein said microcontroller is electrically connected between said first controllable switching element and said detection means, said microcontroller is electrically connected between said second controllable switching element and said detection means, said microcontroller controls a conduction state or cutoff state of said first controllable switching element and said second controllable switching element according to said message carrying sensing signal generated by said detection means;

wherein said detection means is a direct touch interface electrically connected with said microcontroller, wherein when the user contacts the direct touch interface for a time interval, a first voltage sensing signal is detected by said microcontroller with a signal time length corresponding to the time interval which the direct touch interface being continuously contacted, when the user withdraws from the direct touch interface, said detection means delivers a second voltage sensing signal;

wherein when the first controllable switching element and second controllable switching element are in the conduction state, said microcontroller further controls electric power transmission levels from the power source to the first lighting load and the second lighting load according to a signal format of said message carrying sensing signal received from said detection means, the electric power transmission level for the first lighting load ranges from X-watt to Y-watt, the electric power transmission level for the second lighting load ranges from Y-watt to X-watt.

49. The microcontroller based electronic switch according to claim 48, wherein the direct touch interface is a push button or a touch sensor.

\* \* \* \* \*